(12) United States Patent
Taguchi

(10) Patent No.: US 8,037,954 B2
(45) Date of Patent: Oct. 18, 2011

(54) ELECTRIC VEHICLE AND VEHICLE CHARGING SYSTEM

(75) Inventor: Tomonari Taguchi, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 430 days.

(21) Appl. No.: 12/443,754

(22) PCT Filed: Oct. 1, 2007

(86) PCT No.: PCT/JP2007/069542
§ 371 (c)(1),
(2), (4) Date: Mar. 31, 2009

(87) PCT Pub. No.: WO2008/041762
PCT Pub. Date: Apr. 10, 2008

(65) Prior Publication Data
US 2010/0089669 A1 Apr. 15, 2010

(30) Foreign Application Priority Data
Oct. 3, 2006 (JP) .................................. 2006-271800

(51) Int. Cl.
*B60K 1/00* (2006.01)
(52) U.S. Cl. ....................................... 180/65.1; 165/10
(58) Field of Classification Search ................. 180/65.1, 180/65.22, 68.1, 68.2, 68.5; 123/142.5 R, 123/142.5 E, 41.14; 165/10, 136, 240, 42
See application file for complete search history.

(56) References Cited

U.S. PATENT DOCUMENTS

| | | | |
|---|---|---|---|
| 3,870,855 A * | 3/1975 | Edlund et al. | 123/142.5 E |
| 5,909,099 A * | 6/1999 | Watanabe et al. | 320/108 |
| 6,464,027 B1 * | 10/2002 | Dage et al. | 180/65.22 |
| 6,575,258 B1 * | 6/2003 | Clemmer | 180/68.5 |
| 7,654,351 B2 * | 2/2010 | Koike et al. | 180/68.5 |
| 7,669,647 B2 * | 3/2010 | Tsubone et al. | 123/142.5 R |
| 7,900,727 B2 * | 3/2011 | Shinmura | 180/68.1 |

FOREIGN PATENT DOCUMENTS

| | | |
|---|---|---|
| JP | 54-4735 Y2 | 2/1979 |
| JP | 5-178070 A | 7/1993 |
| JP | 5-238245 A | 9/1993 |
| JP | 5-330331 A | 12/1993 |

(Continued)

OTHER PUBLICATIONS

Notice of Grounds of Rejection mailed Jul. 6, 2010 in Japanese Application No. 2006-271800 and translation thereof.

*Primary Examiner* — Hau Phan
(74) *Attorney, Agent, or Firm* — Kenyon & Kenyon LLP

(57) ABSTRACT

When a current flows through a battery, a resistance loss proportional to the square of the current is produced by an internal resistance component of the current. In a case where the temperature of a heat capacity element is raised, a charging current is controlled such that prescribed thermal energy is provided to the heat capacity element by this resistance loss. Air is induced into a power supply unit through a vehicle compartment air exhaust duct. Then, the thermal energy stored in the heat capacity element is transferred to the air induced into the power supply unit. The air to which the thermal energy has been provided from the heat capacity element is blown out toward a vehicle compartment space by a fan.

12 Claims, 11 Drawing Sheets

FOREIGN PATENT DOCUMENTS

| | | |
|---|---|---|
| JP | 5-338432 A | 12/1993 |
| JP | 3013892 U | 5/1995 |
| JP | 8-126121 A | 5/1996 |
| JP | 08-214412 | 8/1996 |
| JP | 10-306722 A | 11/1998 |
| JP | 2004331024 A1 | 11/2004 |
| JP | 2005-276733 A | 10/2005 |
| JP | 2006-248360 A | 9/2006 |

* cited by examiner

NORMAL DRIVING MODE

DURING CHARGING

EV DRIVING MODE

FIG.11A
INPUT VOLTAGE Vin
INPUT CURRENT Iin
DURING NORMAL CHARGING
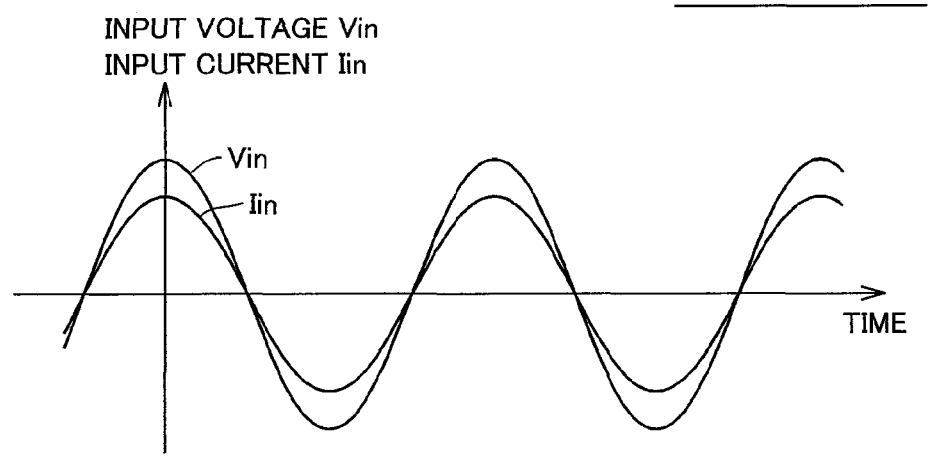
FIG.11B
INPUT VOLTAGE Vin
INPUT CURRENT Iin
DURING HEAT STORAGE CHARGING
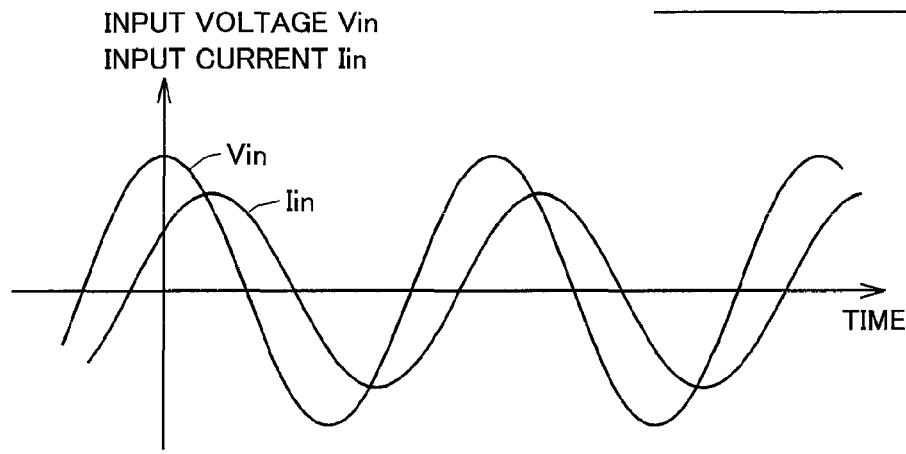
FIG.12
(a) $P_{in} = V_{in} \times I_{in}$
(b) $P_{in} = V_{in} \times I_{in} \times \cos\theta$

DURING CHARGING

EV DRIVING MODE

ELECTRIC VEHICLE AND VEHICLE CHARGING SYSTEM

This is a 371 national phase application of PCT/JP2007/069542 filed 01 Oct. 2007, claiming priority to Japanese Patent Application No. 2006-271800 filed 03 Oct. 2006, the contents of which are incorporated herein by reference.

TECHNICAL FIELD

The present invention relates to a technique for charging a power storage device configured to be rechargeable by an external power supply in an electric vehicle having the power storage device mounted thereon. In particular, the present invention relates to a technique for storing thermal energy in a vehicle, in addition to charge electric power.

BACKGROUND ART

So-called electric vehicles such as electrical vehicles, hybrid vehicles or fuel cell vehicles are equipped with a power storage device made up of a secondary battery, a capacitor or the like, and generate driving force from electric power stored in the power storage device through a motor.

A configuration has been proposed in which the power storage device mounted on these electric vehicles is charged by an external power supply such as a system power supply or a solar cell. As for a hybrid vehicle, in particular, if the cost of charging by an external power supply is lower than that of electric power generation by a mounted engine, the overall driving cost can be suppressed by charging the power storage device by the external power supply.

The power storage device is often formed of a secondary battery utilizing the electrochemical action, and the charge/discharge characteristics thereof are significantly affected by temperature. Therefore, a configuration has been proposed in which a reduction in temperature of the power storage device is suppressed in the electric vehicle where the power storage device is configured to be rechargeable by the external power supply.

For example, Japanese Patent Laying-Open No. 08-214412 discloses a charge control apparatus for a power storage device for use on an electric vehicle including: a charging period calculating means for calculating a necessary charging period based on an amount of electric energy discharged from the power storage device for use on the electric vehicle when charging is commanded, a detected power supply voltage value and a predetermined charging current value; and a charging start time calculating means for calculating a charging start time to finish the charging at the indicated scheduled boarding time based on the indicated scheduled boarding time and the calculated necessary charging period. According to the invention disclosed in this Japanese Patent Laying-Open No. 08-214412, since the charging is finished at the scheduled boarding time, the period of time for which the power storage device is left to stand after it has been charged will be short, and any reduction in the capacity due to a temperature drop can be small.

In the electric vehicle put to practical use, however, it is also necessary to ensure not only the power storage device but also the passenger comfort. In other words, in winter, summer and the like, air-conditioning (heating or cooling) of a vehicle compartment space is required. This air-conditioning in the vehicle compartment requires a relatively large power source. Therefore, electric power to be used for generation of vehicle driving force is used for air-conditioning in the vehicle compartment, and the traveling performance may be restricted due to the power storage device. In other words, out of an amount of electric energy stored in the power storage device, an amount of electric energy that can be ensured for vehicle traveling may be decreased, and the distance that can be traveled may be shortened. Furthermore, out of electric power that can be discharged from the power storage device, electric power that can be ensured for vehicle traveling may be decreased, and the driving force that can be generated may be reduced.

DISCLOSURE OF THE INVENTION

The present invention has been made to solve the above-described problems and an object thereof is to provide an electric vehicle and a vehicle charging system where the traveling performance due to a motor can be maintained while the passenger comfort is ensured.

According to an aspect of the present invention, there is provided an electric vehicle on which a power storage device configured to be rechargeable is mounted and that is configured such that the power storage device can be charged by an external power supply. The electric vehicle is configured to be able to be coupled, during charging, to a connector portion for supplying the external power supply. The electric vehicle includes: a heat capacity element configured to be able to store thermal energy; a heat storage mechanism for having thermal energy stored in the heat capacity element by using external energy supplied from outside the vehicle through the connector portion during charging; and an air-conditioning mechanism for air-conditioning a vehicle compartment space by using the thermal energy stored in the heat capacity element, in response to an air-conditioning request.

When the mounted power storage device is charged by the external power supply, the electric vehicle according to the present invention has thermal energy stored therein by receiving the external energy. Upon receipt of the air-conditioning request after charging is completed, the vehicle compartment space is air-conditioned by using the stored thermal energy, not the electric power stored in the power storage device. As a result, it is not necessary to use the discharging power from the power storage device to air-condition the vehicle compartment space. Therefore, since most of the discharging power from the power storage device can be ensured for the motor, the traveling performance due to the motor can be maintained while the passenger comfort is ensured.

Preferably, the heat capacity element is configured by at least a part of a component of the power storage device.

More preferably, the heat storage mechanism includes a charging current controller for controlling a charging current of the power storage device such that prescribed thermal energy is provided to the power storage device by resistive heat generation due to the charging current.

More preferably, the electric vehicle is configured to be able to receive an external heat medium having certain thermal energy from outside the vehicle through the connector portion, in addition to the external power supply, during charging. The heat storage mechanism further includes a heat medium path configured to cause heat exchange between the power storage device and the external heat medium supplied through the connector portion.

More preferably, air-conditioned air in a building outside the vehicle is supplied as the external heat medium.

Preferably, the electric vehicle further includes a vehicle compartment air path configured to communicate with the vehicle compartment space and configured to take in air in the vehicle compartment space to cause heat exchange between the air and the power storage device. The air-conditioning mechanism includes a backflow mechanism for forming a flow of air in the vehicle compartment air path in a direction opposite to a direction in which the air is taken in from the vehicle compartment space such that the air after the heat exchange between the air and the power storage device is blown out toward the vehicle compartment space.

Preferably, the electric vehicle further includes: an electric power converting portion capable of generating a charging current for charging the power storage device from the external power supply; a radiator portion for cooling the electric power converting portion through a first coolant; a circulating mechanism for circulating the first coolant in a circulating path including the electric power converting portion and the radiator portion; and a storage portion, disposed at the circulating path, configured to be able to store the first coolant. The heat capacity element includes the first coolant. The electric power converting portion is configured to include a switching element. The heat storage mechanism further includes a controller adapted to the electric power converting portion for controlling the electric power converting portion during charging such that a cooling ability in the radiator portion is suppressed, and in addition, prescribed thermal energy is provided to the first coolant by a heat loss produced at the electric power converting portion due to a switching operation.

More preferably, the electric vehicle further includes a rotating electric machine having a coil of a phase connected in a star shape. The electric power converting portion is configured to receive the external power supply through a neutral point of the rotating electric machine. The circulating path is formed to further include the rotating electric machine. The controller adapted to the electric power converting portion further controls the electric power converting portion such that prescribed thermal energy is provided to the first coolant by resistive heat generation that occurs in the coil of the phase of the rotating electric machine.

More preferably, the air-conditioning mechanism further includes a blowing out mechanism for blowing out air-conditioned air to the vehicle compartment space, a first coolant introduction path through which the first coolant is guided to the blowing out mechanism, and a first heat exchange portion for causing heat exchange between air and the first coolant guided through the first coolant introduction path to generate the air-conditioned air.

Preferably, the heat capacity element includes a refrigerant contained in a refrigerant container. The heat storage mechanism further includes a refrigeration cycle mechanism for having thermal energy stored in the refrigerant by receiving the external power supply and by performing a refrigeration cycle during charging.

More preferably, the air-conditioning mechanism further includes a blowing out mechanism for blowing out air-conditioned air to the vehicle compartment space, a second coolant introduction path that is formed to cause heat exchange between a second coolant and the refrigerant and through which the second coolant after the heat exchange is guided to the blowing out mechanism, and a second heat exchange portion for causing heat exchange between air and the second coolant guided through the second coolant introduction path to generate the air-conditioned air.

According to another aspect of the present invention, there is provided a vehicle charging system, including: an electric vehicle on which a power storage device configured to be rechargeable is mounted; and a vehicle charging apparatus for charging the power storage device mounted on the electric vehicle by an external power supply. The vehicle charging apparatus includes a connector portion coupled to the electric vehicle during charging for supplying the external power supply to the electric vehicle. The electric vehicle includes a heat capacity element configured to be able to store thermal energy, a heat storage mechanism for having thermal energy stored in the heat capacity element by using external energy supplied from outside the vehicle through the connector portion during charging, and an air-conditioning mechanism for air-conditioning a vehicle compartment space by using the thermal energy stored in the heat capacity element, in response to an air-conditioning request. The heat capacity element is configured by at least a part of a component of the power storage device. The vehicle charging apparatus is configured to supply an external heat medium having certain thermal energy from outside the vehicle through the connector portion, in addition to the external power supply, during charging. The heat storage mechanism includes a heat medium path configured to cause heat exchange between the power storage device and the external heat medium supplied through the connector portion.

When the mounted power storage device is charged by the external power supply, the electric vehicle according to the present invention has thermal energy stored therein by receiving the external energy. Upon receipt of the air-conditioning request after charging is completed, the vehicle compartment space is air-conditioned by using the stored thermal energy, not the electric power stored in the power storage device. As a result, it is not necessary to use the discharging power from the power storage device to air-condition the vehicle compartment space. Therefore, since most of the discharging power from the power storage device can be ensured for the motor, the traveling performance due to the motor can be maintained while the passenger comfort is ensured.

Preferably, the vehicle charging apparatus supplies air-conditioned air in a building outside the vehicle to the electric vehicle as the external heat medium.

Preferably, the electric vehicle is configured to communicate with the vehicle compartment space. The electric vehicle further includes a vehicle compartment air path configured to take in air in the vehicle compartment space to cause heat exchange between the air and the power storage device. The air-conditioning mechanism includes a backflow mechanism for forming a flow of air in the vehicle compartment air path in a direction opposite to a direction in which the air is taken in from the vehicle compartment space such that the air after the heat exchange between the air and the power storage device is blown out toward the vehicle compartment space.

According to the present invention, the traveling performance due to the power storage device can be maintained while the passenger comfort is ensured.

BRIEF DESCRIPTION OF THE DRAWINGS

FIGS. 11A and 11B show time waveforms of an external current and an external voltage shown in FIG. 7.

FIG. 12 is a vector diagram for showing a phase relationship between the external current and the external voltage shown in FIGS. 11A and 11B.

BEST MODES FOR CARRYING OUT THE INVENTION

Figure 1:
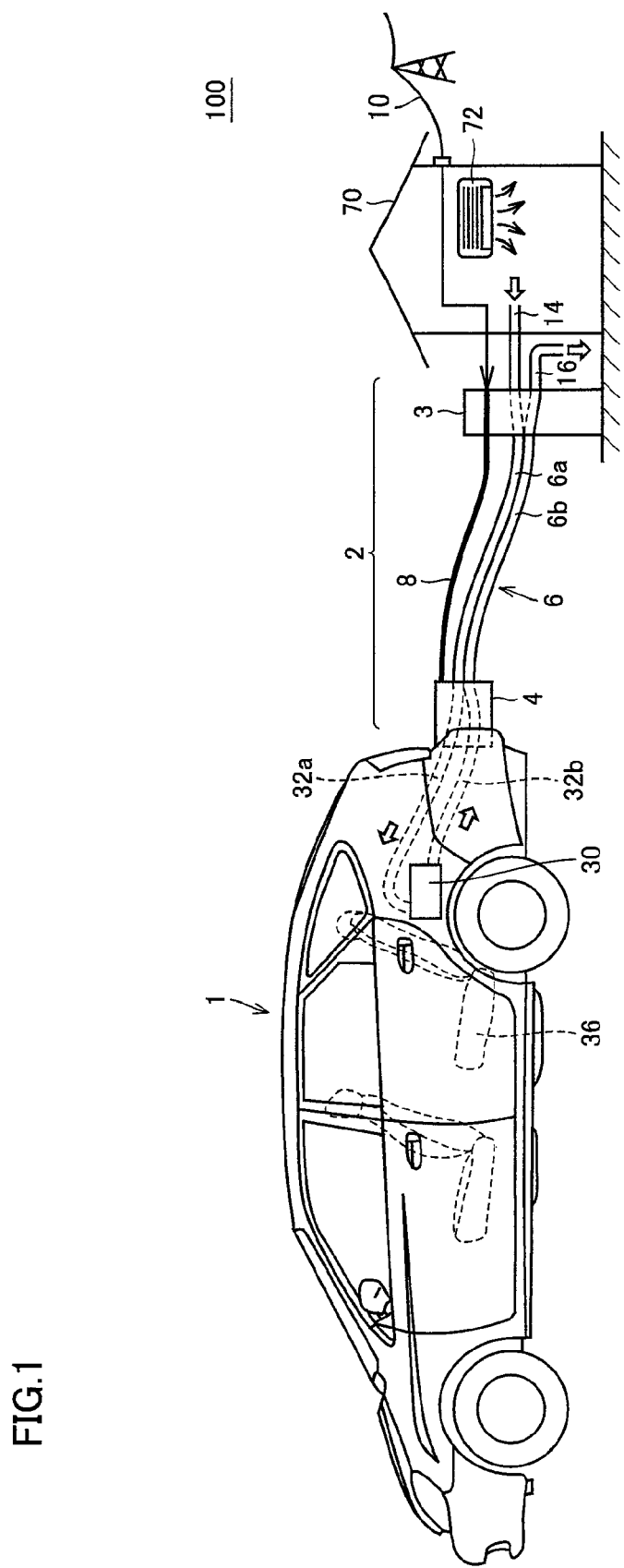
FIG. 1 is a schematic diagram of a vehicle charging system according to a first embodiment of the present invention.

The embodiments of the present invention will be described in detail with reference to the drawings. The same or corresponding portions in the drawings are represented by the same reference characters, and the description thereof will not be repeated.

First Embodiment

Referring to FIG. 1, a vehicle charging system 100 according to a first embodiment of the present invention includes an electric vehicle 1 and a vehicle charging apparatus 2.

Electric vehicle 1 is a hybrid vehicle as an example and has a power supply unit 30 mounted thereon. Power supply unit 30 is mainly for supplying electric power to a motor (not shown) that generates driving force of electric vehicle 1, and is configured to include a power storage device configured to be rechargeable. The power storage device is not limited to a secondary battery, but may be a fuel cell, a capacitor or the like. In a case where the power storage device is a secondary battery, the power storage device may be any of a lead-acid battery, a lithium-ion battery and a nickel-hydride battery, or may be a different type of battery from those batteries. It is noted that electric vehicle 1 may be an electrical vehicle, a fuel cell vehicle or the like as long as electric vehicle 1 has power supply unit 30 mounted thereon.

In the following description, a configuration where the power storage device is a secondary battery (that will also be referred to simply as "battery" hereinafter) and includes a battery pack that is made up of a plurality of battery modules will be described.

Electric vehicle 1 can travel by using driving force by an engine (not shown) and driving force by the motor, and kinetic energy of electric vehicle 1 is regenerated into the battery during braking or the like. In particular, electric vehicle 1 according to the present embodiment has an "EV (Electrical Vehicle) driving mode" in which the vehicle travels by using only the driving force from the motor, in addition to a "normal driving mode" in which the vehicle travels by using the engine and the motor. In the following description, the operation during charging and in the "EV driving mode" will be mainly described.

In the present embodiment, a part of the components of the battery is configured as a heat capacity element. Electric vehicle 1 has thermal energy stored in the heat capacity element (battery) by using external energy supplied from outside the vehicle during charging. Specifically, a component having relatively high specific heat such as electrolytes and/or separators that are included in the plurality of battery modules forming the battery functions as the heat capacity element. It is noted that "thermal energy" herein means a situation in which there is a temperature difference when compared to an ambient temperature, and includes both of a situation in which the temperature is higher when compared to the ambient temperature and a situation in which the temperature is lower when compared to the ambient temperature. In electric vehicle 1, in response to an air-conditioning request from an occupant or the like, a vehicle compartment space of electric vehicle 1 is air-conditioned by using the thermal energy stored in the heat capacity.

Vehicle charging apparatus 2 includes a charging station 3, a connector portion 4, an electric power supply line 8, and an external heat medium conduit 6.

Connector portion 4 is configured to be able to be coupled to electric vehicle 1, and is connected to charging station 3 via electric power supply line 8 and external heat medium conduit 6. Connector portion 4 supplies an external power supply to electric vehicle 1 during charging, and in addition, supplies an external heat medium having certain thermal energy to electric vehicle 1.

Electric power supply line 8 is an electric power line through which the external power supply for charging the battery mounted on electric vehicle 1 is supplied. Electric power supply line 8 has one end connected to electric vehicle 1 via connector portion 4, and the other end electrically connected to an electric power system 10. In other words, electric power supply line 8 electrically connects electric vehicle 1 to a system power supplied through electric power system 10. It is noted that, instead of the system power, electric power generated by a solar cell panel installed on a roof or the like of a building 70 may be supplied to electric vehicle 1. Electric power supply line 8 is formed of a cab tire cable or the like having flexibility so that connector portion 4 can be arranged freely.

External heat medium conduit 6 includes an outside air-conditioned air supply conduit 6a and an outside air-conditioned air discharge conduit 6b, and is formed of a rubber tube or the like having flexibility. Outside air-conditioned air supply conduit 6a has one end connected to connector portion 4, and the other end inserted into building 70. An air conditioner 72 or the like is installed in building 70 to be air-conditioned to a prescribed comfort temperature (for example, 18° C. to 25° C.). Therefore, the air-conditioned air within building 70 (that will be referred to simply as "outside air-conditioned air" hereinafter) can be supplied to electric vehicle 1 as the external heat medium through outside air-conditioned air supply conduit 6a. Outside air-conditioned air discharge conduit 6b has one end connected to connector portion 4, and the other end placed in the atmosphere outside building 70. Therefore, the outside air-conditioned air within electric vehicle 1 carried through outside air-conditioned air discharge conduit 6b is released outside building 70.

Charging station 3 is installed in the proximity of both of a parking space for electric vehicle 1 and building 70, and includes a take-up mechanism for electric power supply line 8 and external heat medium conduit 6, a mechanism for housing connector portion 4 (both of them are not shown) or the like. In addition, charging station 3 may include a security mechanism for a user, an accounting mechanism or the like.

Figure 2:
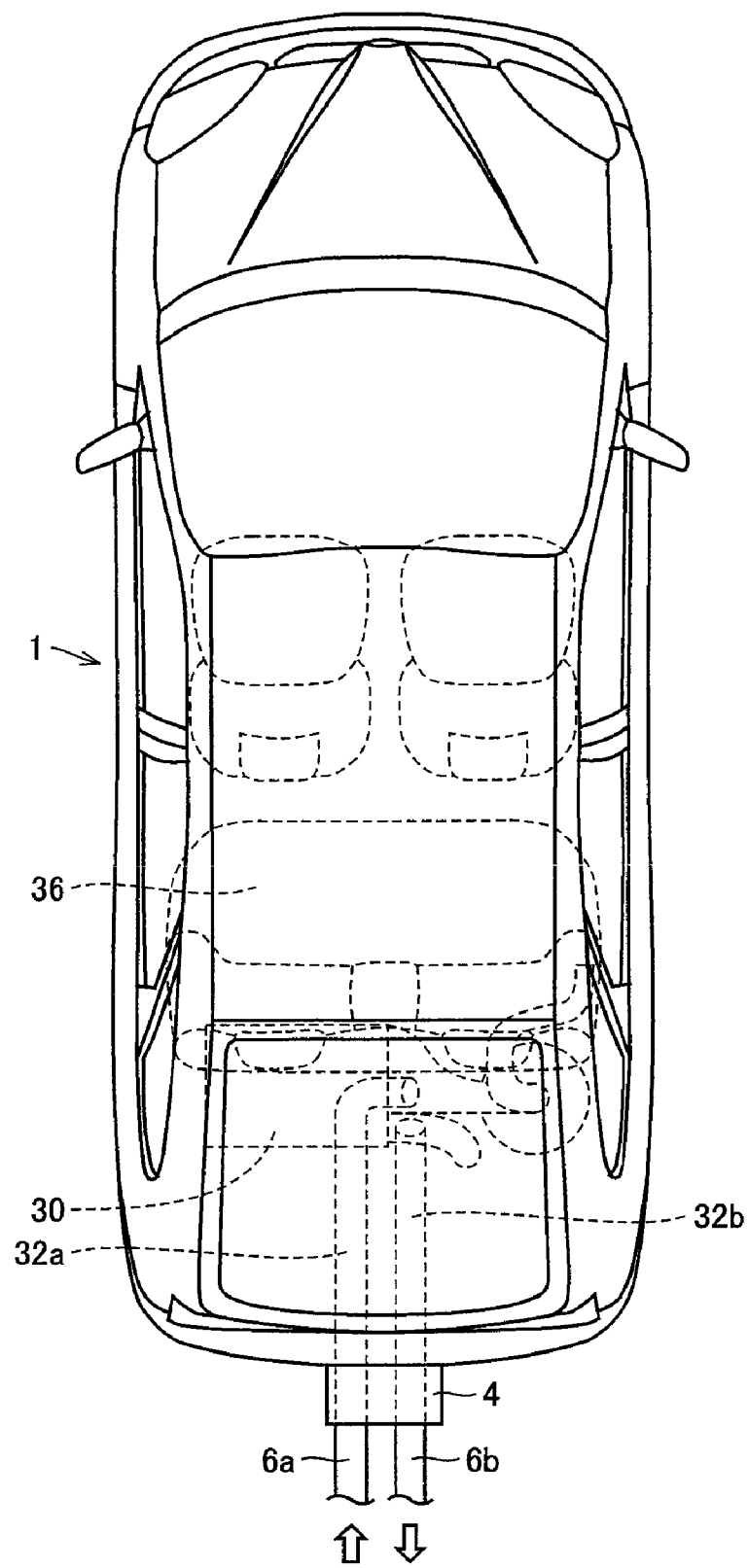
FIG. 2 is a top view of an electric vehicle shown in FIG. 1.

Referring to FIGS. 1 and 2, power supply unit 30 is located behind a rear seat 36 placed in the vehicle compartment space of electric vehicle 1, and above a luggage room floor. Placed in electric vehicle 1 is an outside air intake duct 32a through which the outside air-conditioned air supplied through outside air-conditioned air supply conduit 6a is guided to power supply unit 30 when connector portion 4 is coupled for charging by the external power supply.

In power supply unit 30, the battery is placed so as to cause heat exchange between the battery and the guided outside air-conditioned air. As a result, the thermal energy of the outside air-conditioned air is transferred to the battery and stored in the heat capacity element of the battery. In addition, placed in electric vehicle 1 is an outside air exhaust duct 32b through which the outside air-conditioned air whose thermal energy has been transferred is guided to outside air-conditioned air discharge conduit 6b.

In the present embodiment, a manner is illustrated in which a configuration where thermal energy is stored in the heat capacity element of the battery by the external heat medium supplied from outside the vehicle as described above (that is, the outside air-conditioned air from inside building 70) as well as a configuration where thermal energy is stored by resistive heat generation due to a charging current of the battery are both used.

Figure 3:
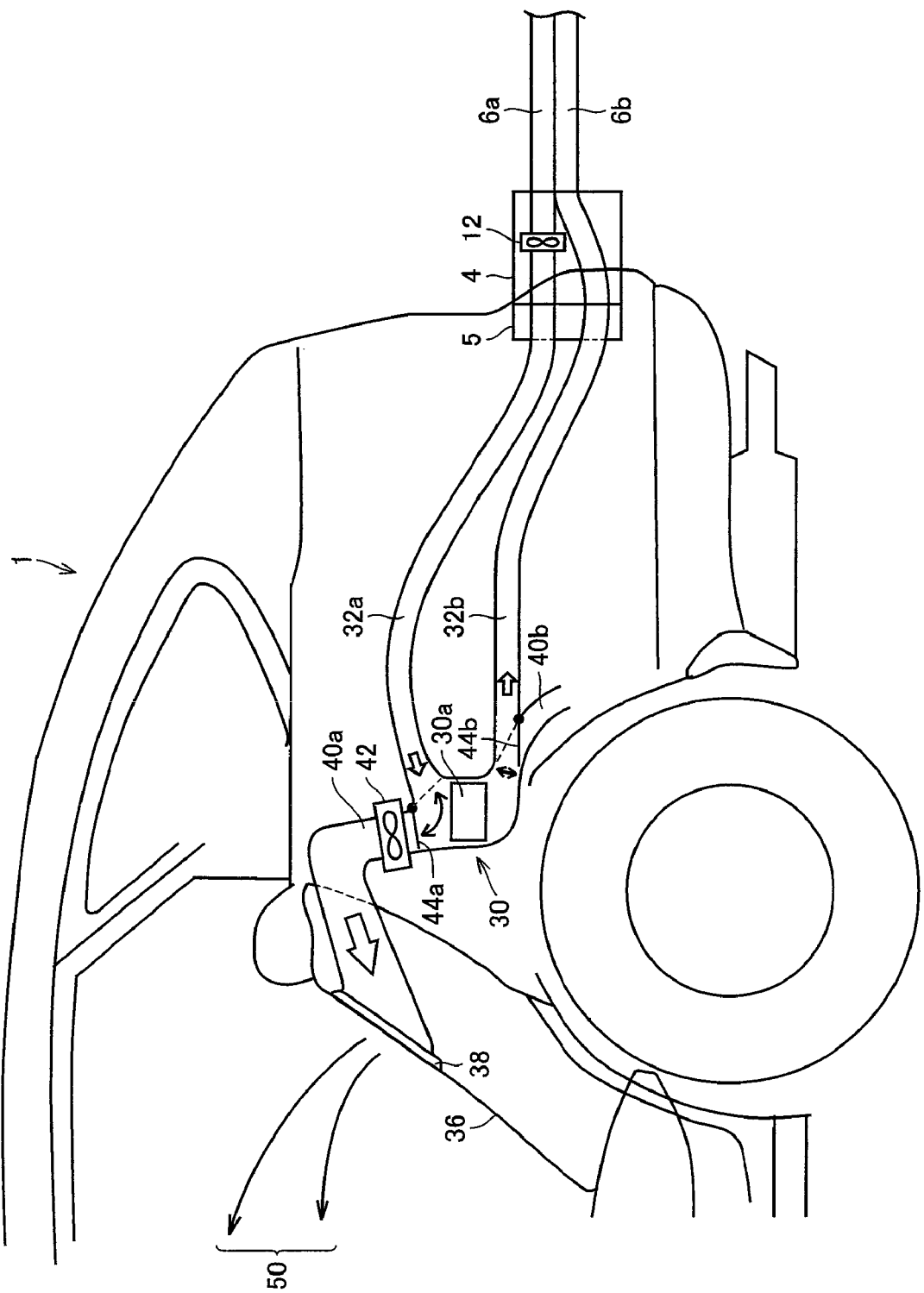
FIG. 3 is a diagram for illustrating a flow of air-conditioned air supplied to the electric vehicle.

Referring to FIG. 3, during charging, connector portion 4 is coupled to a connector inserting portion 5 formed at electric vehicle 1. Outside air intake duct 32a and outside air exhaust duct 32b are positioned by connector inserting portion 5 so as to communicate with outside air-conditioned air supply conduit 6a and outside air-conditioned air discharge conduit 6b, respectively.

Placed in connector portion 4 is a blowing fan 12 by which the outside air-conditioned air supplied through outside air-conditioned air supply conduit 6a is circulated within electric vehicle 1. Blowing fan 12 is disposed at outside air-conditioned air supply conduit 6a, and compresses and delivers the outside air-conditioned air at a prescribed delivery pressure. By this blowing fan 12, the outside air-conditioned air supplied through outside air-conditioned air supply conduit 6a flows through outside air intake duct 32a, power supply unit 30, outside air exhaust duct 32b, and outside air-conditioned air discharge conduit 6b in turn. It is noted that a suction fan may be disposed at outside air exhaust duct 32b instead of or in addition to the configuration where blowing fan 12 is disposed at outside air-conditioned air supply conduit 6a.

A battery 30a, a part of whose components functions as the heat capacity element, is placed within power supply unit 30 such that the outside air-conditioned air supplied through outside air intake duct 32a flows in contact with a surface of battery 30a. In other words, battery 30a is configured to cause heat exchange between battery 30a and the outside air-conditioned air, and the thermal energy of the outside air-conditioned air is transferred between battery 30a and the outside air-conditioned air.

In addition, provided at power supply unit 30 is a vehicle compartment air intake duct 40a through which the air in the vehicle compartment space (that will also be referred to simply as "vehicle compartment air" hereinafter) is taken in to cause heat exchange between battery 30a and the vehicle compartment air, mainly in the "normal driving mode". It is noted that the vehicle compartment space mainly refers to a space where occupants stay. This vehicle compartment air intake duct 40a is provided to use the vehicle compartment air for temperature management of battery 30a in the "normal driving mode" where heating by using exhaust heat of the engine and/or cooling by using the driving force of the engine are/is available. Specifically, vehicle compartment air intake duct 40a is configured to communicate with the vehicle compartment space through an intake opening 38 that is placed in the side of rear seat 36 (an area having no contact with the back or shoulder of the occupant) of electric vehicle 1. A fan 42 is disposed at an intermediate part of vehicle compartment air intake duct 40a.

Furthermore, provided at power supply unit 30 is a vehicle compartment air exhaust duct 40b through which the vehicle compartment air having been used for temperature management of battery 30a is discharged to the luggage room.

Fan 42 is a bidirectional fan, and is configured such that the vehicle compartment air can be induced from the vehicle compartment space and guided to power supply unit 30, and in addition, such that the air can be delivered from power supply unit 30 toward the vehicle compartment space. It is noted that, instead of this configuration, an induction fan for induction from the vehicle compartment space toward power supply unit 30, as well as a delivery fan by which the air is delivered from power supply unit 30 toward the vehicle compartment space may be placed in parallel to vehicle compartment air intake duct 40a.

In addition, switching dampers 44a and 44b are provided at power supply unit 30. Switching damper 44a operates such that any one of outside air intake duct 32a and vehicle compartment air intake duct 40a communicates with power supply unit 30. Similarly, switching damper 44b operates such that any one of outside air exhaust duct 32b and vehicle compartment air exhaust duct 40b communicates with power supply unit 30.

Figure 4A:
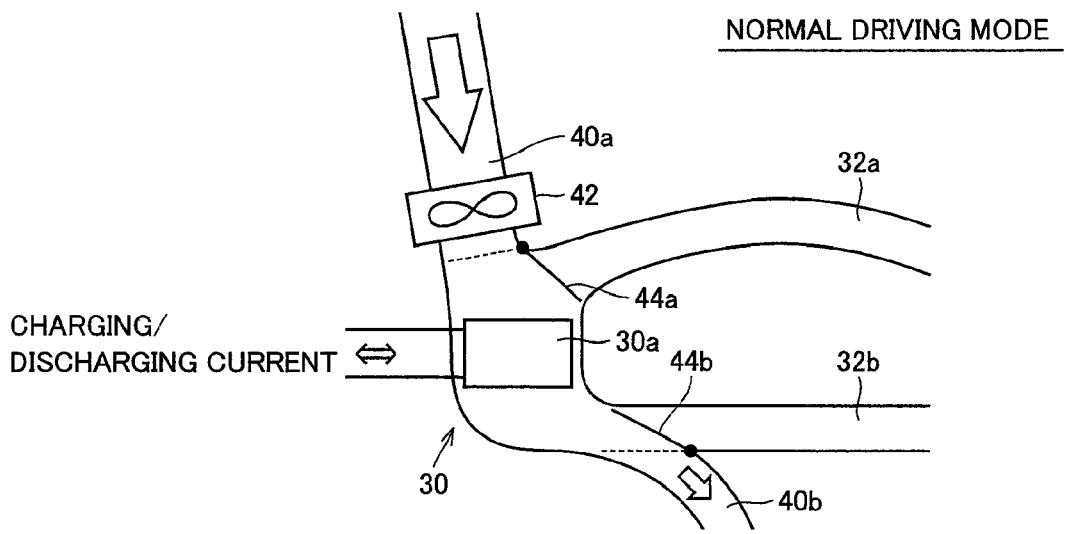
FIGS. 4A to 4C are diagrams for illustrating a flow of the air in a power supply unit.

A flow of the air in power supply unit 30 will be described hereinafter with reference to FIGS. 3 and 4A to 4C. FIG. 4A shows a flow of the air in the "normal driving mode," FIG. 4B shows a flow of the air in a case where thermal energy is stored (during charging), and FIG. 4C shows a flow of the air in the "EV driving mode."

Referring to FIGS. 3 and 4A, in the "normal driving mode," a charging/discharging current flows to/from battery 30a, depending on the situation in which electric vehicle 1 travels. In this "normal driving mode," air-conditioning (heating or cooling) is performed by mainly using the driving force or exhaust heat of the engine. Here, fan 42 operates such that the vehicle compartment air from the vehicle compartment space is induced toward power supply unit 30. At this time, switching of switching damper 44a is performed such that vehicle compartment air intake duct 40a communicates with power supply unit 30. Furthermore, switching of switching damper 44b is performed such that power supply unit 30 communicates with vehicle compartment air exhaust duct 40b.

Then, in power supply unit 30, heat exchange is performed between battery 30a and the vehicle compartment air induced by fan 42. As a result, battery 30a is maintained at the temperature substantially equal to that of the vehicle compartment space. Furthermore, the vehicle compartment air after the heat exchange between battery 30a and the vehicle compartment air is discharged to the luggage room through vehicle compartment air exhaust duct 40b.

Figure 4B:
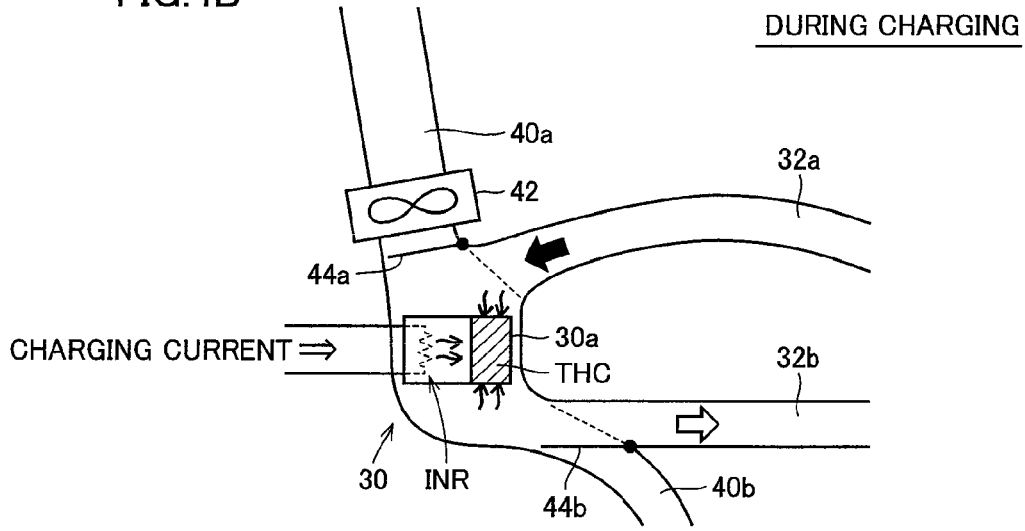
Figure 4C:
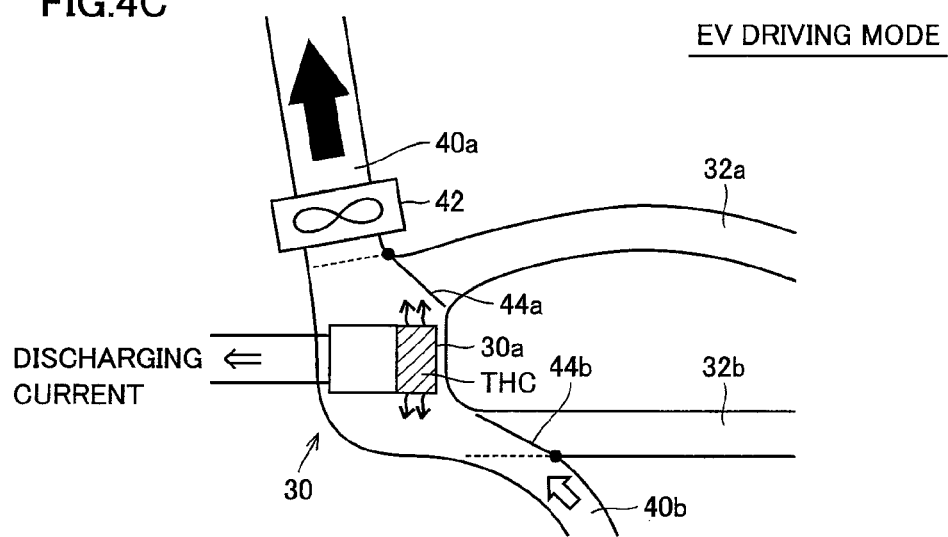

Referring to FIGS. 3 and 4B, during charging of battery 30a by the external power supply, thermal energy is stored in a heat capacity element THC included in battery 30a. Specifically, the temperature of heat capacity element THC is raised or heat capacity element THC is cooled in response to an air-conditioning request (a heating request or a cooling request) that is expected to be provided from the occupant. It is noted that the air-conditioning request that is expected to be provided from the occupant can be determined, typically based on a measured value from a temperature sensor (not shown) measuring the ambient temperature outside the vehicle. Alternatively, the air-conditioning request can also be determined, based on an air-conditioning request provided during the last traveling or the date and time (season) at present.

At least one of a charging current provided to battery 30a and the temperature and air volume of the outside air-conditioned air provided to battery 30a is adjusted in accordance with the thermal energy to be stored in heat capacity element THC. In other words, the external power supply and the outside air-conditioned air are used as the external energy for storage of thermal energy in heat capacity element THC.

It is noted that switching of switching damper 44a is performed such that outside air intake duct 32a communicates with power supply unit 30. Furthermore, switching of switching damper 44b is performed such that power supply unit 30 communicates with outside air exhaust duct 32b.

(1) Rise in Temperature of Heat Capacity Element THC (Heating Request)

In a case of rise in temperature of heat capacity element THC, the charging current is controlled such that resistive heat generation due to the charging current of battery 30a is increased. When the current flows through battery 30a, a resistance loss proportional to the square of the current is produced by an internal resistance component INR of battery 30a. This resistance loss is converted to thermal energy. Therefore, the charging current is controlled such that prescribed thermal energy is provided to heat capacity element THC by this resistance loss. As described above, the resistance loss is produced in proportion to the square of the charging current. Therefore, the larger the charging current is, the more the efficiency for increasing the temperature is enhanced. On the other hand, a chargeable current in accordance with SOC (State of Charge) is defined for battery 30a. This chargeable current indicates a permissible maximum value of the charging current at each point in time. Therefore, a value of the charging current to battery 30a is controlled to match the chargeable current at each point in time.

In addition, the thermal energy of the outside air-conditioned air may be provided to heat capacity element THC. In a case where the outside air-conditioned air has certain thermal energy, that is, the outside air-conditioned air having a temperature that is not lower than a prescribed temperature can be supplied, the air volume delivered by blowing fan 12 (FIG. 3) is set to be relatively large in order to increase an amount of contact between battery 30a and the outside air-conditioned air.

It is noted that, in a case where the temperature of the supplied outside air-conditioned air is not higher than a prescribed value, delivery of the air by blowing fan 12 (FIG. 3) may be stopped in order to suppress thermal energy dissipated from heat capacity element THC (thermal energy loss).

(2) Cooling of Heat Capacity Element THC (Cooling Request)

In a case of cooling of heat capacity element THC, the air volume delivered by blowing fan 12 (FIG. 3) is controlled such that the thermal energy of the outside air-conditioned air is provided to heat capacity element THC. As described above, in the present embodiment, the outside air-conditioned air from inside building 70 (FIG. 1) outside the vehicle is supplied. Therefore, the external heat medium having a relatively low temperature can be ensured. The air volume delivered by blowing fan 12 (FIG. 3) is set to be relatively large in order to increase an amount of contact between battery 30a and the outside air-conditioned air to promote absorption of heat from battery 30a.

On the other hand, resistive heat generation due to the charging current of battery 30a inhibits cooling of heat capacity element THC. Therefore, in a case where heat capacity element THC is cooled, the charging current of battery 30a is controlled to be as small as possible. Specifically, a permissible maximum charging time of battery 30a is determined based on a preset scheduled traveling start time of electric vehicle 1. A minimum value of the charging current is determined based on the relationship between the determined maximum charging time and an amount of charge required for battery 30a.

Referring to FIGS. 3 and 4C, in a case where charging of battery 30a is completed and electric vehicle 1 travels in the "EV driving mode," the thermal energy stored in heat capacity element THC is used for air-conditioning of the vehicle compartment space.

Specifically, fan 42 operates such that the air is delivered from power supply unit 30 toward the vehicle compartment space. In other words, fan 42 provides a flow of the air in vehicle compartment air intake duct 40a in a direction opposite to the direction in which the vehicle compartment air is taken in. Switching of switching damper 44a is performed such that vehicle compartment air intake duct 40a communicates with power supply unit 30. Furthermore, switching of switching damper 44b is performed such that power supply unit 30 communicates with vehicle compartment air exhaust duct 40b.

As a result of the above-described operation, heat exchange is performed between battery 30a and the air induced through vehicle compartment air exhaust duct 40b into power supply unit 30. In other words, the thermal energy stored in heat capacity element THC is transferred to the air induced into power supply unit 30. Then, the air to which the thermal energy has been provided from heat capacity element THC is blown out toward the vehicle compartment space by fan 42. The air blown out toward the vehicle compartment space in this manner becomes a vehicle compartment air-conditioned air 50 (FIG. 3) in the "EV driving mode."

Figure 5:
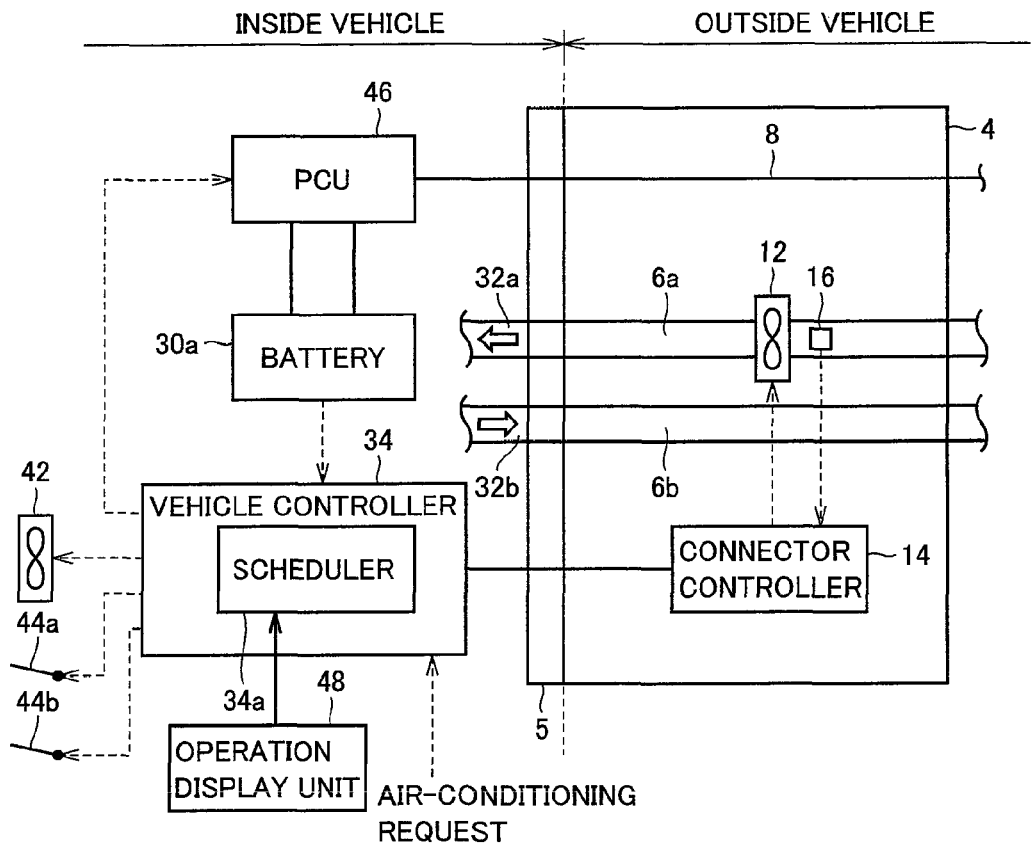
FIG. 5 is a schematic configuration diagram of a control structure of the vehicle charging system according to the first embodiment of the present invention.

Next, a control structure of vehicle charging system 100 according to the first embodiment of the present invention will be described with reference to FIG. 5.

Connector portion 4 of vehicle charging apparatus 2 further includes a connector controller 14 and an outside air-conditioned air temperature sensor 16. Electric vehicle 1 further includes a PCU (Power Control Unit) 46, a vehicle controller 34 and an operation display unit 48.

Electric power supply line 8 is electrically connected to PCU 46 through connector portion 4 and connector inserting portion 5. PCU 46 is an electric power converting portion, and generates a charging current (DC current) for charging battery 30a from the external power supply (AC power supply) supplied through electric power supply line 8 and supplies the generated charging current to battery 30a. PCU 46 controls the magnitude of the charging current supplied to battery 30a, in accordance with a current set value from vehicle controller 34.

Operation display unit 48 is incorporated into an instrument panel, a car navigation system or the like located in front of the driver's seat. Operation display unit 48 is configured to be able to receive an operation command from the occupant, and in addition, is configured to be able to display the condition of each equipment.

Connector controller 14 and vehicle controller 34 are configured to allow interactive communication via connector portion 4 and connector inserting portion 5 Connector controller 14 and vehicle controller 34 cooperate with each other to control the storage of thermal energy in heat capacity element THC as shown in FIG. 4B.

Specifically, vehicle controller 34 is configured to include a scheduler 34a. Scheduler 34a receives the scheduled traveling start time set by the occupant or the like, through operation display unit 48. Then, scheduler 34a determines an air-conditioning request that is expected to be provided from the occupant, and in addition, obtains SOC of battery 30a and determines a charging start time. In addition, scheduler 34a also determines the magnitude of the charging current to battery 30a during charging. Meanwhile, connector controller 14 obtains the temperature of the outside air-conditioned air provided to outside air-conditioned air supply conduit 6a from outside air-conditioned air temperature sensor 16, and sends the obtained temperature to vehicle controller 34. Upon arrival of the charging start time determined by scheduler 34a, vehicle controller 34 provides a switching command to switching dampers 44a and 44b, and in addition, sends a delivered air volume command for blowing fan 12 to connector controller 14. In response to this delivered air volume command, connector controller 14 provides a corresponding rotational speed command to blowing fan 12.

With these procedures, thermal energy is stored in heat capacity element THC during charging of battery 30a.

After charging of battery 30a is completed and connector portion 4 is detached from electric vehicle 1, vehicle controller 34 having received the air-conditioning request from the occupant or the like controls air-conditioning of the vehicle compartment space by using the thermal energy stored in heat capacity element THC. Specifically, vehicle controller 34 provides a switching command to switching dampers 44a and 44b, and provides a rotational speed command in accordance with the air-conditioning request to fan 42.

Figure 6:
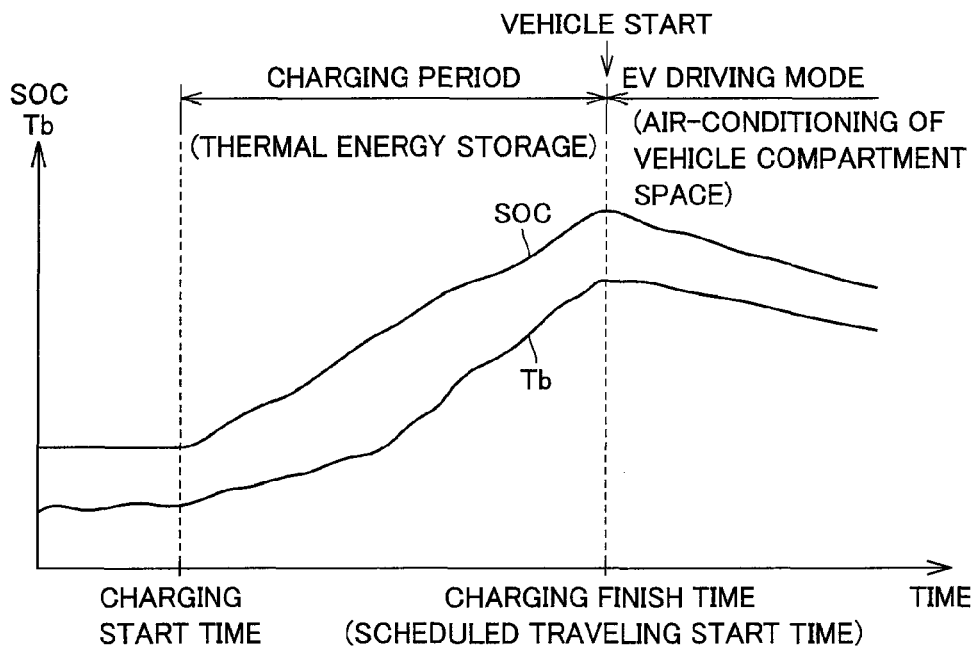
FIG. 6 shows an example of a temporal change in a case where the temperature of a heat capacity element is raised in preparation for a heating request.

FIG. 6 shows an example of a temporal change in a case where the temperature of heat capacity element THC is raised in preparation for the heating request. Referring to FIGS. 5 and 6, scheduler 34a of vehicle controller 34 determines a charging start time and a charging finish time, based on the scheduled traveling start time provided from the occupant or the like. In this example, the charging finish time is determined so as to match the scheduled traveling start time.

Upon arrival of the charging start time, vehicle controller 34 provides a current command to PCU 46, and supply of the charging current to battery 30a is initiated. With this supply of the charging current, SOC of battery 30a starts increasing. In parallel with this charging operation of battery 30a, thermal energy is provided to heat capacity element THC by resistive heat generation due to the charging current. Furthermore, the thermal energy of the outside air-conditioned air is transferred to heat capacity element THC. As a result of this supply of the thermal energy, a battery temperature Tb of battery 30a is raised.

At the charging finish time, SOC of battery 30a reaches a prescribed value, and in addition, prescribed thermal energy is stored in heat capacity element THC. Battery temperature Tb of battery 30a also reaches a prescribed value.

Thereafter, upon detachment of connector portion 4 and the initiation of traveling of electric vehicle 1 in the "EV driving mode," the electric power stored in battery 30a is consumed mainly for generation of the driving force from the motor. Furthermore, the thermal energy stored in heat capacity element THC of battery 30a is used for air-conditioning in the vehicle compartment. In a case of short-distance travel, electric vehicle 1 often arrives at a destination before SOC and battery temperature Tb of battery 30a reach lower limits that are permissible in the "EV driving mode." In other words, in a case of relatively short-distance use such as transportation, shopping and the like, it is not necessary to bring the engine into operation although the passenger comfort must be ensured. Therefore, an environmentally-friendly electric vehicle can be achieved.

It is noted that, in the first embodiment of the present invention described above, the manner is illustrated in which the configuration where thermal energy is stored by resistive heat generation due to the charging current of battery 30a as well as the configuration where thermal energy is stored by the outside air-conditioned air are both used. The effect of the present invention can, however, be achieved even only by any one of the configurations. In other words, in a cold region or the like where only heating is required, the temperature of heat capacity element THC may only be raised, and only the configuration where thermal energy is stored by resistive heat generation due to the charging current of battery 30a may be included.

5As for the correspondence between the invention described in the claims of the present application and the configuration described in the first embodiment of the present invention, outside air intake duct 32a and outside air exhaust duct 32b correspond to "heat medium path," vehicle compartment air intake duct 40a corresponds to "vehicle compartment air path," fan 42 corresponds to "backflow mechanism," and vehicle controller 34 corresponds to "charging current controller."

According to the first embodiment of the present invention, when mounted battery 30a is charged by the external power supply, electric vehicle 1 has thermal energy stored therein by receiving the external power supply and the outside air-conditioned air. Upon receipt of the air-conditioning request from the occupant or the like after charging is completed, the vehicle compartment space is air-conditioned by using the thermal energy stored in the heat capacity element of battery 30a, not the electric power stored in battery 30a. As a result, it is not necessary to use the discharging power from battery 30a to air-condition the vehicle compartment space. Therefore, since most of the discharging power from battery 30a can be ensured for the motor, the traveling performance in the "EV driving mode" can be maintained while the passenger comfort is ensured.

In addition, the traveling performance in the "EV driving mode" can be maintained, so that it is not necessary to bring the engine into operation, and a reduction in amount of exhaust gas of the engine, a reduction in noise and the like can be achieved.

Furthermore, according to the first embodiment of the present invention, since the battery that is also mounted on a conventional hybrid vehicle is used as the heat capacity element, it is not necessary to mount a special heat capacity element for storage of thermal energy. Therefore, the present invention can be implemented at relatively low cost.

Second Embodiment

Although the manner in which a part of the battery is configured as the heat capacity element is illustrated in the first embodiment of the present invention described above, any other heat capacity element may be used. In a second embodiment of the present invention, a configuration where a cooling path such as the PCU is used as the heat capacity element is illustrated.

The overall configuration of a vehicle charging system in the present embodiment is similar to that of vehicle charging system 100 according to the first embodiment of the present invention shown in FIG. 1, and the detailed description thereof will not be repeated. In the present embodiment, it is not necessarily required that the outside air-conditioned air be supplied from outside the vehicle. In other words, a configuration where only the external power supply is used as the external energy for storage of thermal energy in the heat capacity element is described in the present embodiment.

Figure 7:
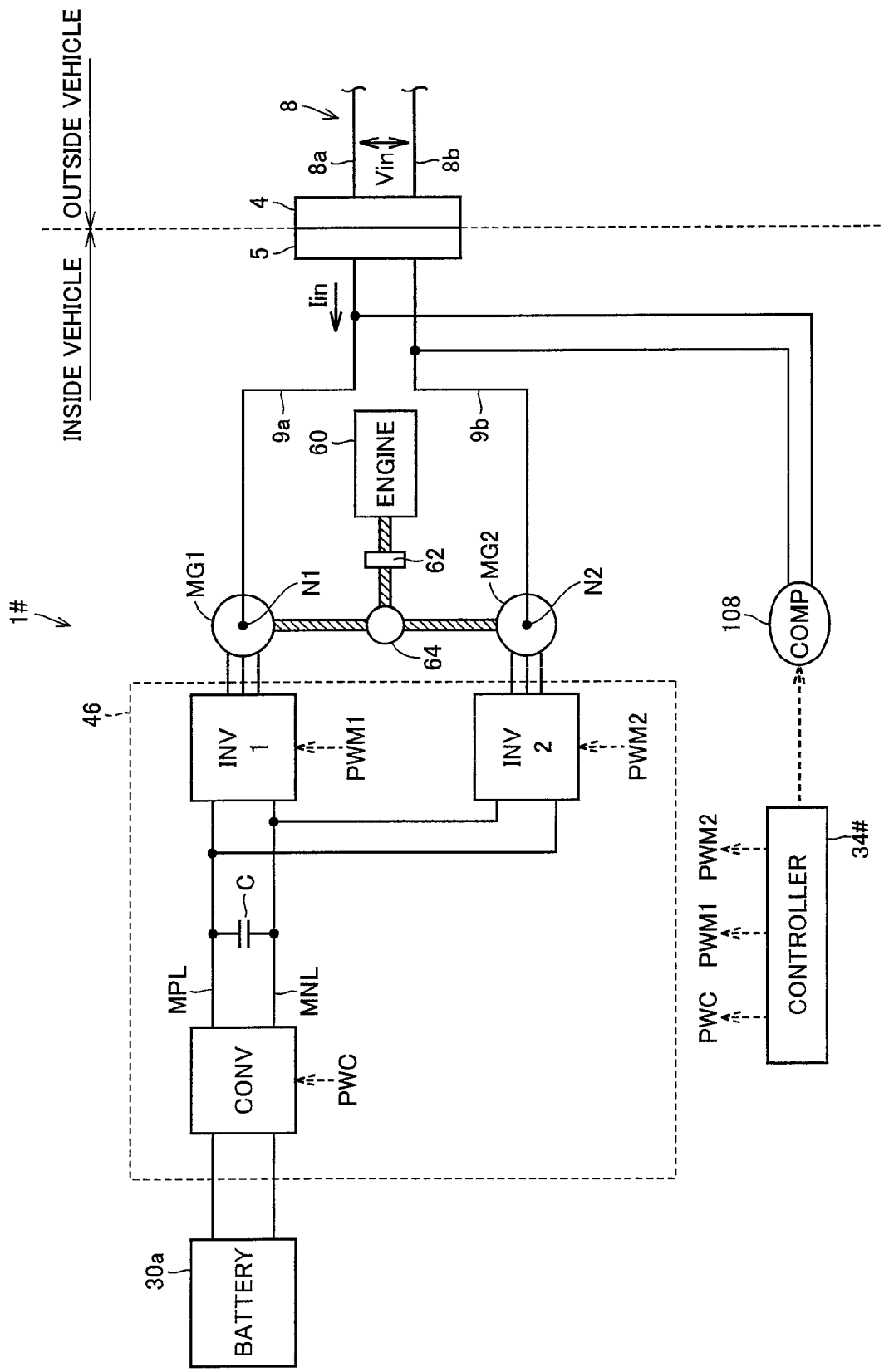
FIG. 7 is a schematic configuration diagram of a substantial portion associated with charging of a battery in an electric vehicle according to a second embodiment of the present invention.

Referring to FIG. 7, an electric vehicle 1# according to the second embodiment of the present invention is a hybrid vehicle, similarly to electric vehicle 1 according to the first embodiment of the present invention. Electric vehicle 1# includes connector inserting portion 5, a positive side receiving line 9a and a negative side receiving line 9b, motors MG1 and MG2, an engine 60, a power split device 64, a powertrain 62, PCU 46, battery 30a, a compressor (COMP) 108, and a controller 34#.

Connector inserting portion 5 is coupled to connector portion 4 during charging, and receives the external power supply through electric power supply line 8. It is noted that the external power supply is a single-phase AC or a two-phase AC including two phase voltages, and electric power supply line 8 is made up of a positive side supply line 8a and a negative side supply line 8b.

Positive side receiving line 9a and negative side receiving line 9b have one ends electrically connected to neutral points of motors MG1 and MG2, respectively. Positive side receiving line 9a and negative side receiving line 9b have the other ends electrically connected to positive side supply line 8a and negative side supply line 8b, respectively, through connector inserting portion 5 and connector portion 4.

As an example, each of motors MG1 and MG2 is a three-phase AC rotating electric machine equipped with a rotor having a permanent magnet embedded therein. In addition, in the present embodiment, each of motors MG1 and MG2 is equipped with a stator including coils of phases corresponding to the three phases, and the coils of the respective phases have one ends electrically connected to one another. In other words, motors MG1 and MG2 include the coils of the phases corresponding to the three phases connected in a Y shape (connected in a star shape), and a node at which the coils of the respective phases are electrically connected to one another corresponds to neutral points N1 and N2, respectively.

Output shafts of motors MG1 and MG2 are mechanically coupled to engine 60 with power split device 64 interposed therebetween. In the "normal driving mode," engine 60 is intermittently brought into operation depending on the traveling situation, and the driving force thereof is transmitted to wheels (not shown) via powertrain 62. Furthermore, a part of the driving force is provided to either motor MG1 or MG2, and is used for electric power generation. In the "EV driving mode," at least one of motors MG1 and MG2 generates driving force by receiving the discharging power from battery 30a. The generated driving force is transmitted to the wheels (not shown) via powertrain 62.

Battery 30a is similar to that in the first embodiment of the present invention described above, and the detailed description thereof will not be repeated.

PCU 46 is configured to be able to generate driving electric power for driving motors MG1 and MG2 by receiving the discharging power from battery 30a, Furthermore, PCU 46 is configured to be able to convert, toward battery 30a, the regenerative electric power generated during braking or the like of electric vehicle 1# by motors MG1 and MG2 that function as generators.

In addition, PCU 46 is configured to be able to generate a charging current (DC current) for charging battery 30a from the external power supply (AC power supply) supplied from outside the vehicle and to supply the generated charging current to battery 30a. In other words, PCU 46 is configured to receive the external power supply through neutral points N1 and N2 of motors MG1 and MG2, respectively, and battery 30a is charged by the received external power supply.

More specifically, PCU 46 includes inverter devices INV1 and INV2, a smoothing capacitor C, a DC/DC converter CONV, a positive bus MPL, and a negative bus MNL.

Inverter device INV1, inverter device INV2 and DC/DC converter CONV are electrically connected to one another via positive bus MPL and negative bus MNL. Furthermore, smoothing capacitor C is connected between positive bus MPL and negative bus MNL. Smoothing capacitor C stabilizes a line voltage between positive bus MPL and negative bus MNL.

Inverter devices INV1 and INV2 are electrically connected to motors MG1 and MG2, respectively. Furthermore, DC/DC converter CONV is electrically connected to battery 30a. Inverter devices INV1 and INV2 as well as DC/DC converter CONY are configured to include a switching element such as an IGBT (Insulated Gated Bipolar Transistor).

In particular, inverter devices INV1 and INV2 are formed of a bridge circuit including switching elements corresponding to the three phases. In other words, each of inverter devices INV1 and INV2 includes three switching elements on an upper arm side (positive side) and three switching elements on a lower arm side (negative side). In a case where the motors are driven, each of inverter devices INV1 and INV2 generates a three-phase AC current by temporally switching one of the switching elements on the upper arm side and one of the switching elements on the lower arm side to drive them to the ON state, respectively.

On the other hand, in a case where battery 30a is charged, three switching elements are collectively turned on/off on each of the upper arm side and the lower arm side, thereby generating a DC current (charging current).

In the above-described operation mode, three switching elements on the upper arm side can be regarded as being in the same switching state with respect to one another (all are in the ON state or all are in the OFF state). Furthermore, three switching elements on the lower arm side can also be regarded as being in the same switching state with respect to one another. Therefore, since respective phase voltages are equal to each other, a zero voltage vector with respect to the neutral point can be defined.

Figure 8:
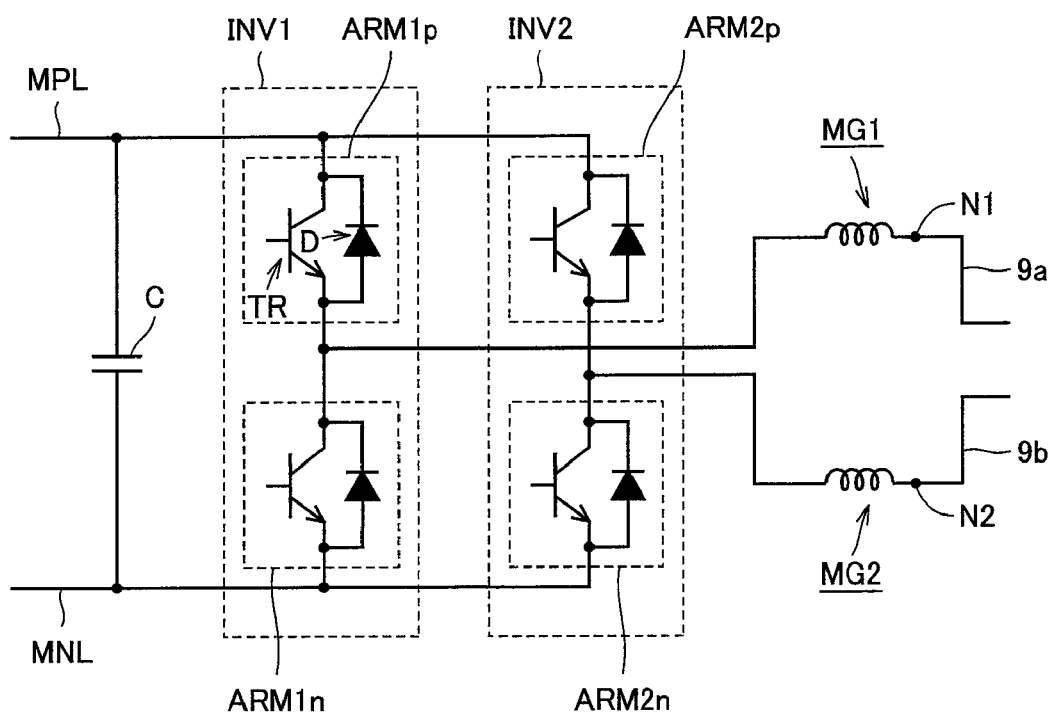
FIG. 8 is a zero-phase equivalent circuit for inverter devices and motors in a case where a zero voltage vector is generated.

FIG. 8 shows a zero-phase equivalent circuit for inverter devices INV1 and INV2 as well as motors MG1 and MG2 in a case where the zero voltage vector is generated.

Referring to FIG. 8, in a case where inverter devices INV1 and INV2 are driven in an operation mode where the zero voltage vector as described above is generated, three switching elements TR on the upper arm side of inverter device INV1 are collectively represented as an upper arm ARM1p. Furthermore, three switching elements TR on the lower arm side of inverter device INV1 are collectively represented as a lower arm ARM1n. Similarly, three switching elements TR on the upper arm side and on the lower arm side of inverter device INV2 are collectively represented as an upper arm ARM2p and a lower arm ARM2n, respectively.

The zero-phase equivalent circuit shown in FIG. 8 can be regarded as a single-phase inverter device that is capable of converting DC electric power supplied through positive bus MPL and negative bus MNL to single-phase AC electric power and outputting the converted electric power through positive side receiving line 9a and negative side receiving line 9b. This single-phase inverter device also allows the rectification (converter) operation. This single-phase inverter device can rectify single-phase AC electric power received through neutral points N1 and N2 of motors MG1 and MG2, and generate DC electric power. In addition, this single-phase inverter device can supply the generated DC electric power to battery 30a through positive bus MPL and negative bus MNL.

Referring again to FIG. 7, compressor 108 is a power source for bringing into operation a refrigeration cycle mechanism that will be described hereinafter, and is actuated by the external power supply provided through positive side receiving line 9a and negative side receiving line 9b.

Controller 34# provides control commands (switching commands PWC, PWM1, PWM2) to PCU 46 during charging of battery 30a. In addition, controller 34# adjusts the control commands to PCU 46 or actuates compressor 108 during charging in response to the air-conditioning request that is expected to be provided from the occupant. Furthermore, at the time of traveling of electric vehicle 1 after charging is completed, controller 34# provides a command to each equipment such that the vehicle compartment space is air-conditioned, in response to the air-conditioning request from the occupant.

Figure 9:
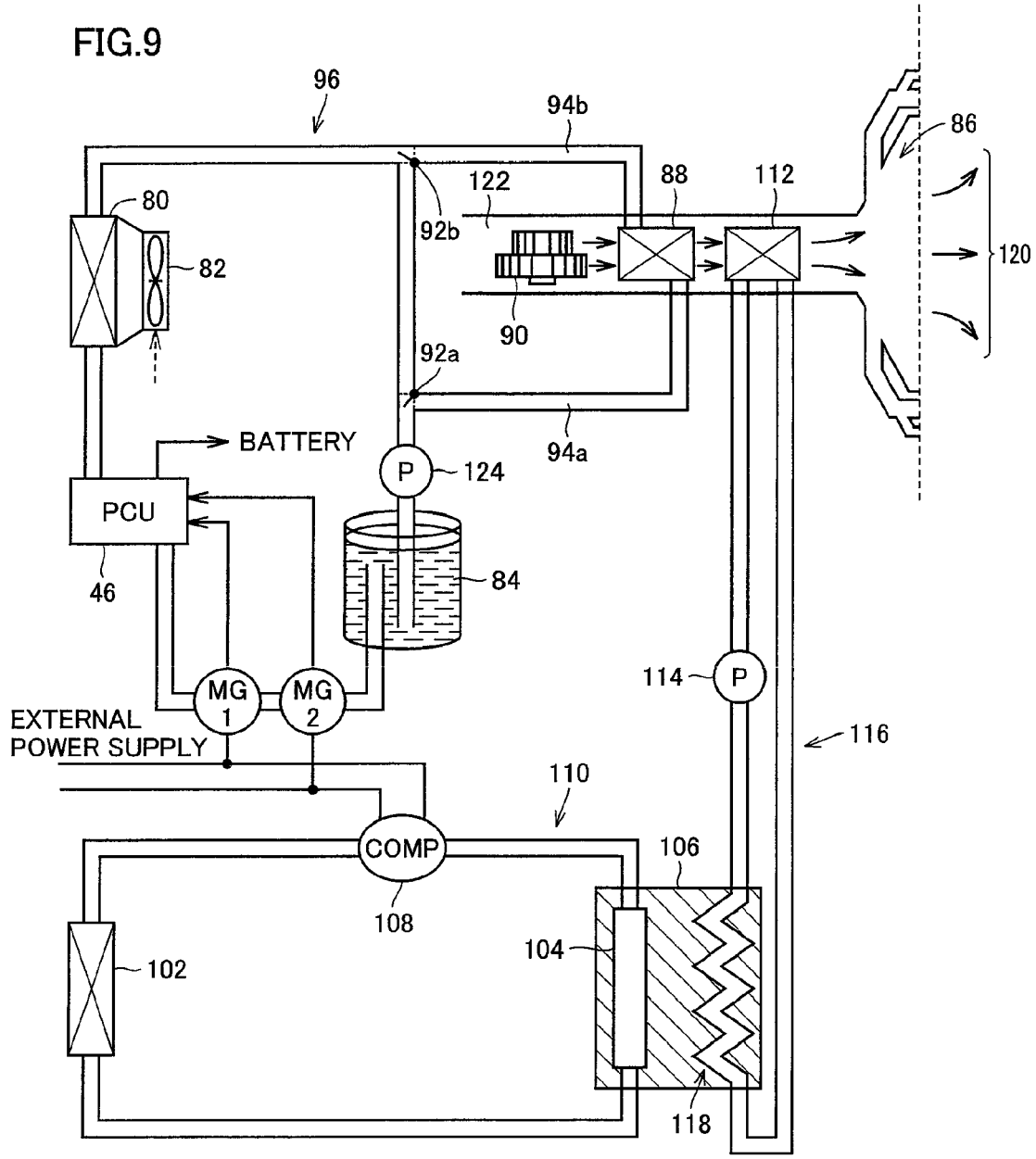
FIG. 9 is a schematic diagram of air-conditioning in a vehicle compartment in the electric vehicle according to the second embodiment of the present invention.

FIG. 9 is a schematic diagram of air-conditioning in the vehicle compartment in electric vehicle 1# according to the second embodiment of the present invention.

Referring to FIG. 9, in electric vehicle 1#, an outlet 86 is located in front of the vehicle compartment space. Air-conditioned air 120 generated within an air-conditioned air generating duct 122 that communicates with outlet 86 is blown out through outlet 86 to the vehicle compartment space. Placed within air-conditioned air generating duct 122 are a blowing fan 90 for delivering outside air or inside air, a heating heat exchange portion 88 for generating air-conditioned air for heating, and a cooling heat exchange portion 112 for generating air-conditioned air for cooling.

In heating heat exchange portion 88, heat exchange is performed between the air delivered by blowing fan 90 and thermal energy (hot heat) of a first coolant flowing through a first coolant circulating path 96 including PCU 46 as well as motors MG1 and MG2. In other words, the first coolant is introduced into heating heat exchange portion 88 through a first coolant introduction path 94a that is branched off from first coolant circulating path 96. It is noted that a liquid substance such as an LLC (Long Life Coolant) is used as the first coolant as an example.

The first coolant after the heat exchange in heating heat exchange portion 88 is returned to first coolant circulating path 96 through a first coolant return path 94b. Switching valves 92a and 92b are provided at a branch point between first coolant circulating path 96 and first coolant introduction path 94a as well as at a branch point between first coolant circulating path 96 and first coolant return path 94b, respectively. As will be described hereinafter, switching of switching valves 92a and 92b is performed, depending on whether or not it is necessary to guide the first coolant flowing through first coolant circulating path 96 to heating heat exchange portion 88.

First coolant circulating path 96 further includes a radiator portion 80, a circulating pump 124 and a heat storage tank 84. Radiator portion 80 is located in front of electric vehicle 1#, and releases the thermal energy of the first coolant outside the vehicle and cools the first coolant. In other words, radiator portion 80 cools PCU 46 as well as motors MG1 and MG2 through the first coolant. In addition, a radiator cooling fan 82 is provided in the proximity of radiator portion 80. Radiator cooling fan 82 increases an amount of contact between radiator portion 80 and air outside the vehicle, and enhances the cooling ability of the first coolant.

It is noted that first coolant circulating path 96 is formed in the proximity of the switching elements included in PCU 46, stator coils of motors MG1 and MG2, and the like, and is configured to have heat dissipated from each portion absorbed into the first coolant.

Circulating pump 124 delivers the first coolant at a prescribed delivery pressure in order to circulate the first coolant in first coolant circulating path 96.

Heat storage tank 84 is configured to be disposed at first coolant circulating path 96 for being able to store a prescribed amount of the first coolant. Heat storage tank 84 has a thermal insulation structure by which heat storage tank 84 is insulated, and can store the thermal energy of the first coolant.

Originally, the main purpose of first coolant circulating path 96 is to cool PCU 46 as well as motors MG1 and MG2. In the present embodiment, however, this first coolant is used as the heat capacity element. In other words, since an external current flows through PCU 46 as well as motors MG1 and MG2 during charging, thermal energy is stored in the first coolant by utilizing resistive heat generation due to the external current. At this time, the cooling ability in radiator portion 80 is suppressed and dissipation of the thermal energy stored in the first coolant is reduced. The vehicle compartment space is heated by using the thermal energy stored in the first coolant, in response to the heating request after charging is completed.

On the other hand, in cooling heat exchange portion 112, heat exchange is performed between the air delivered by blowing fan 90 and thermal energy (cold heat) of a second coolant (for example, CFCs and the like) flowing through a second coolant circulating path 116. At second coolant circulating path 116, a circulating pump 114 for circulating the second coolant is disposed, and in addition, a heat exchange portion 118 for causing heat exchange between the circulating second coolant and a refrigerant contained in a refrigerant container 106 is formed. Therefore, the thermal energy of the refrigerant contained in refrigerant container 106 is provided to the second coolant circulating in second coolant circulating path 116, and is carried to cooling heat exchange portion 112.

Refrigerant container 106 has a thermal insulation structure therearound and the refrigerant contained in refrigerant container 106 is insulated from the surroundings. The refrigerant is a substance that has thermal energy stored therein by changing its state (phase transition) such as water (or ice). As an example, the state of the refrigerant changes from liquid to solid by absorption of thermal energy (heat of solidification), while the refrigerant absorbs thermal energy (heat of fusion) in a process where the state thereof changes from solid to liquid.

An evaporator 104 is further placed within refrigerant container 106. Evaporator 104, compressor 108 and a condenser 102 constitute a refrigeration cycle mechanism 110. This refrigeration cycle mechanism 110 absorbs thermal energy (hot heat) from the refrigerant in refrigerant container 106 through evaporator 104.

A third coolant formed of CFCs and the like, for example, circulates in refrigeration cycle mechanism 110 while changing the state thereof. Specifically, the third coolant is compressed by compressor 108 to high temperature and high pressure, and then, is cooled by condenser 102 and the state of the third coolant changes to liquid. The third coolant in the liquid state is rapidly vaporized by evaporator 104. Since prescribed thermal energy (heat of vaporization) is required for the vaporization of the third coolant, evaporator 104 absorbs the thermal energy (heat of vaporization) required for the vaporization from the refrigerant in refrigerant container 106. Then, thermal energy (cold heat) is stored in the refrigerant.

Here, compressor 108 is configured to be actuated by the external power supply supplied during charging. In other words, refrigeration cycle mechanism 110 is brought into operation during charging of battery 30a and has energy for air-conditioning (cooling) in the vehicle compartment stored therein.

(Heating Operation of Vehicle Compartment Space)

Figure 10A:
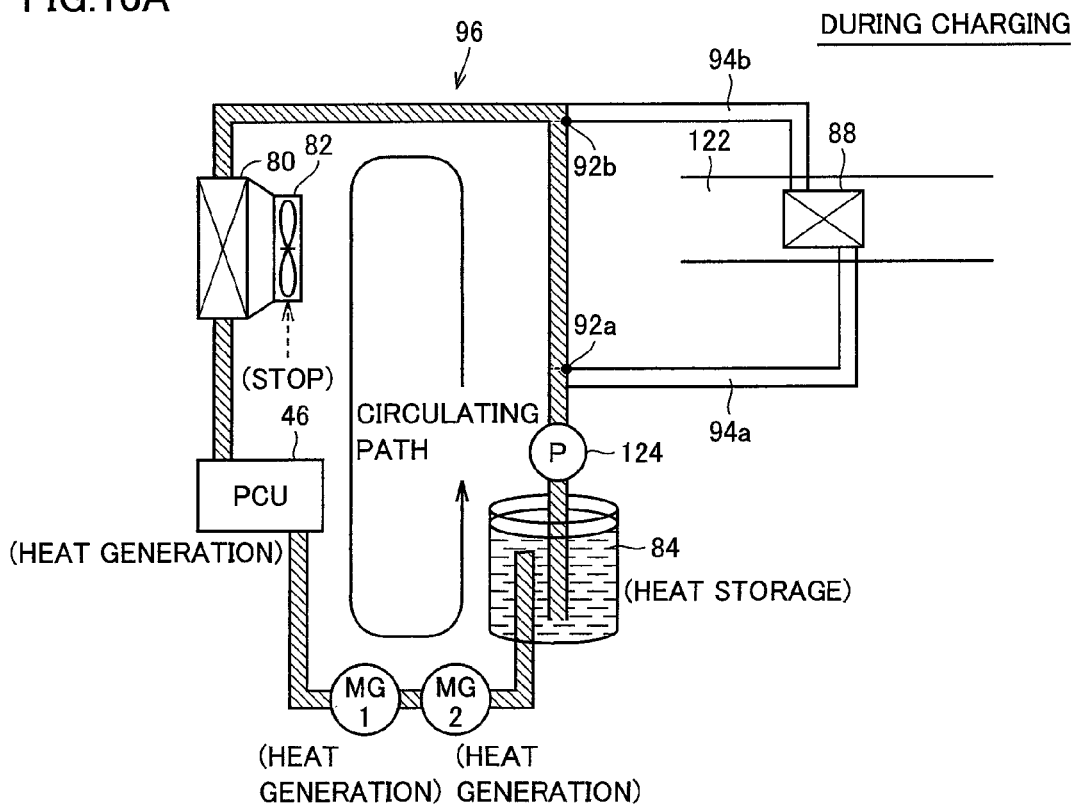
FIGS. 10A and 10B are diagrams for illustrating an operation associated with heating of the vehicle compartment space.
Figure 10B:
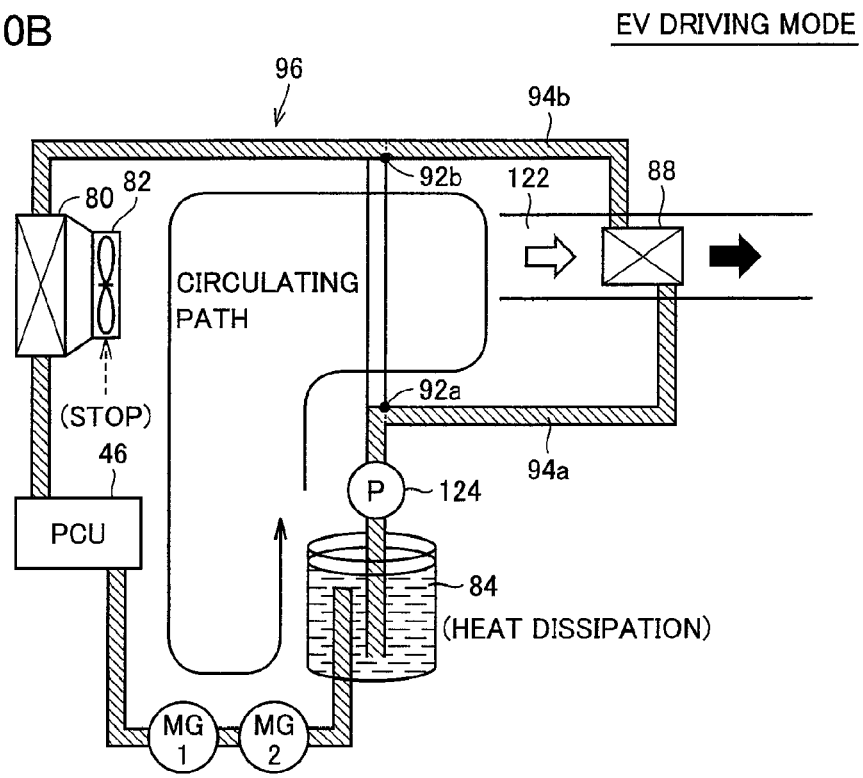

An operation associated with heating of the vehicle compartment space will be described with reference to FIGS. 10A and 10B. FIG. 10A shows a storage operation of thermal energy during charging. FIG. 10B shows a heating operation of the vehicle compartment space in the "EV driving mode."

Referring to FIG. 10A, during charging, switching of switching valves 92a and 92b is performed such that the first coolant circulates through first coolant circulating path 96. In other words, the first coolant is not guided to heating heat exchange portion 88. At the same time, radiator cooling fan 82 is stopped and the cooling ability in radiator portion 80 is suppressed.

Then, heat is generated in PCU 46 as well as motors MG1 and MG2 due to charging of battery 30a, and prescribed thermal energy due to the heat generation is provided to the first coolant. Specifically, in PCU 46, a heat loss produced at the switching elements due to the switching operation is provided to the first coolant. In order to generate more thermal energy, controller 34# (FIG. 7) provides switching commands PWC, PWM1 and PWM2 having higher frequencies to PCU 46.

Furthermore, in motors MG1 and MG2, thermal energy by resistive heat generation due to the external current flowing through the coils of the respective phases is provided to the first coolant. In order to generate more thermal energy, controller 34# controls PCU 46 so as to cause more external current to flow.

FIG. 11 shows time waveforms of an external current Iin and an external voltage Vin shown in FIG. 7. FIG. 11A shows a time waveform during normal charging where generation of thermal energy is not required. FIG. 11B shows a time waveform during heat storage charging where generation of thermal energy is required.

FIG. 12 is a vector diagram for showing a phase relationship between the external current and the external voltage shown in FIGS. 11A and 11B.

Referring to FIGS. 11A and 12, during normal charging, controller 34# provides switching commands to PCU 46 such that a phase difference between external current Iin and external voltage Vin is set to be substantially zero (in phase). In a case where external current Iin is in phase with external voltage Vin in such a manner, external electric power Pin=external voltage Vin×external current Iin as shown in (a) of FIG. 12, and external current Iin can be minimized. In other words, resistive heat generation that occurs in motors MG1 and MG2 or the like can be minimized.

Referring to FIGS. 11B and 12, during heat storage charging, controller 34# provides switching commands to PCU 46 such that a prescribed phase difference is produced between external current Iin and external voltage Vin. In a case where there is a phase difference θ between external current Iin and external voltage Vin in such a manner, external electric power Pin=external voltage Vin×external current Iin×cos θ as shown in (b) of FIG. 12. Therefore, external current #Iin=external current Iin/cos is required in order to receive external electric power Pin that is identical to that during normal charging. In other words, by producing phase difference θ between external current Iin and external voltage Vin, external current Iin can be increased up to (1/cos θ) times as much as the original external current with the external electric power kept constant.

As described above, controller 34# controls PCU 46 such that more thermal energy by resistive heat generation is generated in the coils of the phases of motors MG1 and MG2.

Referring to FIG. 10B, in a case where charging of battery 30a is completed and electric vehicle 1 travels in the "EV driving mode," the thermal energy stored in the first coolant is used for air-conditioning (heating) of the vehicle compartment space.

Specifically, switching of switching valves 92a and 92b is performed such that the first coolant is guided to heating heat exchange portion 88. Then, in heating heat exchange portion 88, heat exchange is performed between the first coolant and the air delivered by blowing fan 90 (FIG. 9), and the resulting warm air is blown out from outlet 86 to the vehicle compartment space. In particular, since the first coolant stored in heat storage tank 84 can be maintained without dissipation of the thermal energy thereof, more thermal energy can be ensured. Therefore, by appropriately designing the storage ability of heat storage tank 84, the heating ability for the vehicle compartment space can be optimized.

(Cooling Operation of Vehicle Compartment Space)

Figure 13A:
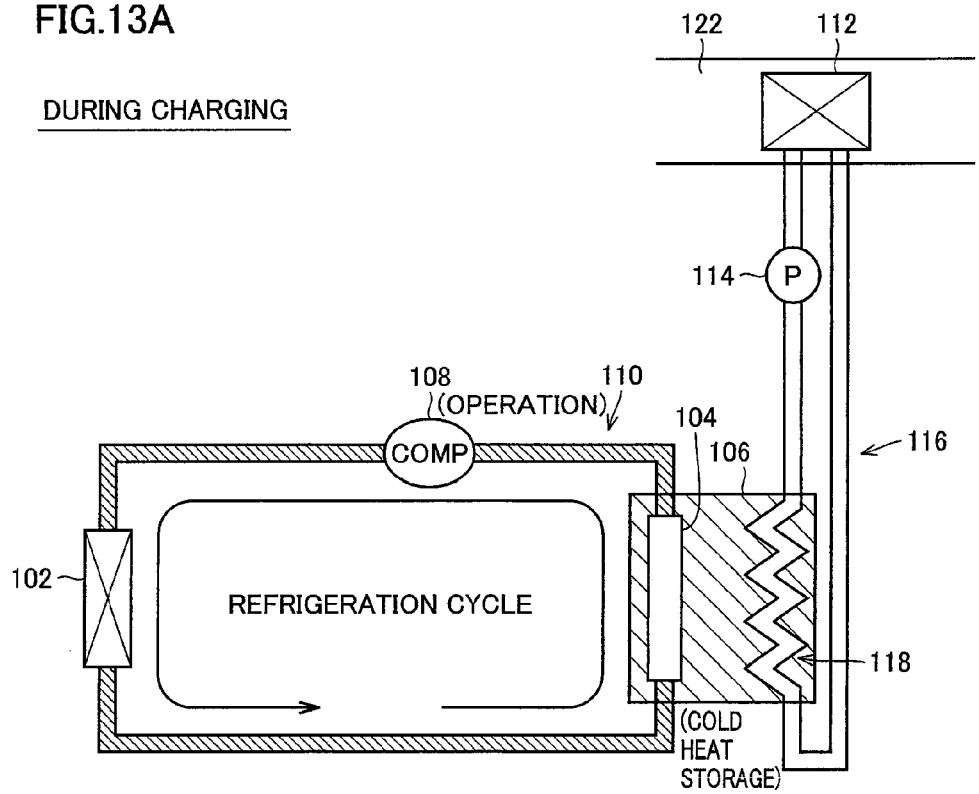
FIGS. 13A and 13B are diagrams for illustrating an operation associated with cooling of the vehicle compartment space.
Figure 13B:
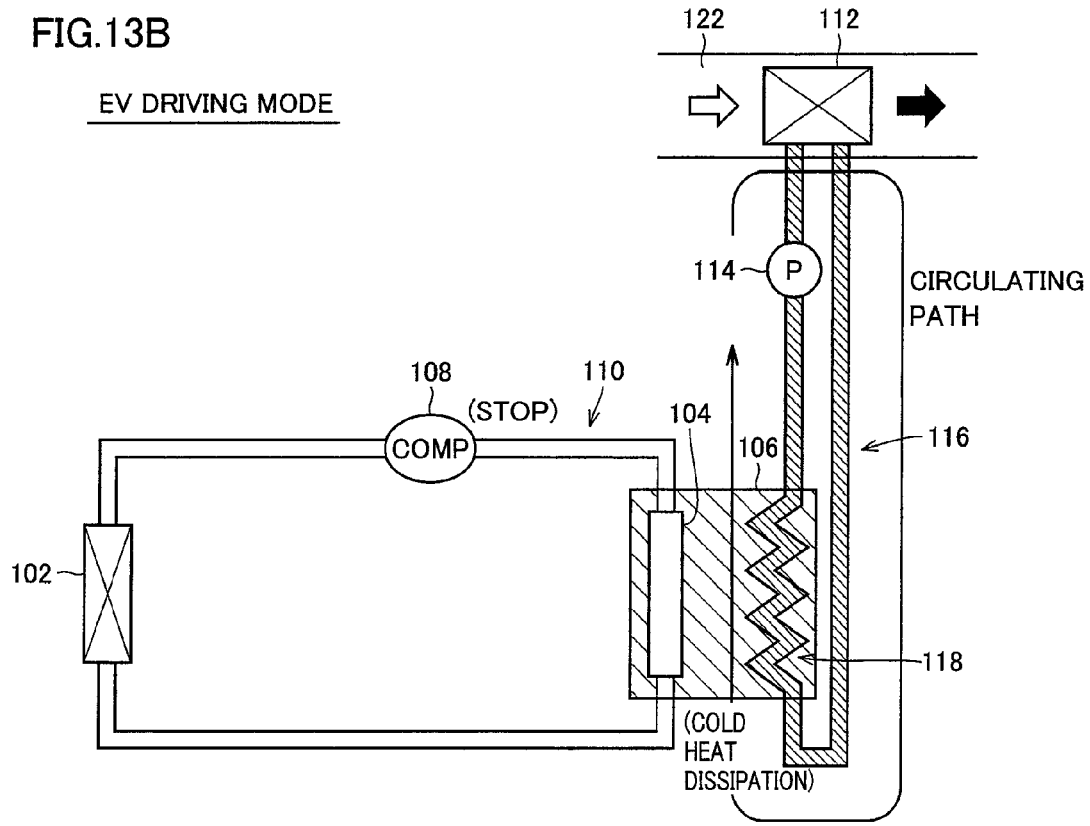

Next, an operation associated with cooling of the vehicle compartment space will be described with reference to FIGS. 13A and 13B. FIG. 13A shows a storage operation of thermal energy during charging. FIG. 13B shows a heating operation of the vehicle compartment space in the "EV driving mode."

Referring to FIG. 13A, during charging, compressor 108 is actuated by the external power supply, and thermal energy (cold heat) is stored in the refrigerant by refrigeration cycle mechanism 110.

Referring to FIG. 13B, in a case where charging of battery 30a is completed and electric vehicle 1 travels in the "EV driving mode," the thermal energy (cold heat) stored in the refrigerant is used for air-conditioning (cooling) of the vehicle compartment space.

Specifically, circulating pump 114 is brought into operation such that the second coolant is guided to cooling heat exchange portion 112. Then, in cooling heat exchange portion 112, heat exchange is performed between the second coolant and the air delivered by blowing fan 90 (FIG. 9), and the resulting cold air is blown out from outlet 86 to the vehicle compartment space. Here, by appropriately designing an amount of the refrigerant contained in refrigerant container 106, the cooling ability for the vehicle compartment space can be optimized.

It is noted that, in the second embodiment of the present invention described above, the manner is illustrated in which the configuration for heating the vehicle compartment space and the configuration for cooling the vehicle compartment space are both provided. The effect of the present invention can, however, be achieved even only by any one of the configurations. In other words, in a cold region or the like where only heating is required, a configuration including only an area associated with first coolant circulating path 96 may be employed.

As for the correspondence between the invention described in the claims of the present application and the configuration described in the second embodiment of the present invention, PCU 46 corresponds to "electric power converting portion," radiator portion 80 corresponds to "radiator portion," first coolant circulating path 96 corresponds to "circulating path," circulating pump 124 corresponds to "circulating mechanism," and heat storage tank 84 corresponds to "storage portion." "Controller adapted to the electric power converting portion" is implemented by controller 34#. Furthermore, motors MG1 and MG2 correspond to "rotating electric machine," and outlet 86 and blowing fan 90 correspond to "blowing out mechanism." Furthermore, first coolant introduction path 94a corresponds to "first coolant introduction path," heating heat exchange portion 88 corresponds to "first heat exchange portion," refrigeration cycle mechanism 110 corresponds to "refrigeration cycle mechanism," second coolant circulating path 116 corresponds to "second coolant introduction path," and cooling heat exchange portion 112 corresponds to "second heat exchange portion."

According to the second embodiment of the present invention, when mounted battery 30a is charged by the external power supply, electric vehicle 1 has thermal energy stored therein by receiving the external power supply. Upon receipt of the air-conditioning request from the occupant or the like after charging is completed, the vehicle compartment space is heated or cooled by using the thermal energy stored in the first coolant or the refrigerant, not the electric power stored in battery 30a. As a result, it is not necessary to use the discharging power from battery 30a to air-condition the vehicle compartment space. Therefore, since most of the discharging power from battery 30a can be ensured for the motors, the traveling performance in the "EV driving mode" can be maintained while the passenger comfort is ensured.

In addition, the traveling performance in the "EV driving mode" can be maintained, so that it is not necessary to bring the engine into operation, and a reduction in amount of exhaust gas of the engine, a reduction in noise and the like can be achieved.

Furthermore, according to the second embodiment of the present invention, in the "normal driving mode," the first coolant in first coolant circulating path 96 used to cool PCU 46 as well as motors MG1 and MG2 is used for heating of the vehicle compartment space. Therefore, it is not necessary to mount a special heat capacity element for storage of thermal energy, and the present invention can be implemented at relatively low cost.

It should be understood that the embodiments disclosed herein are illustrative and not limitative in any respect. The scope of the present invention is defined by the terms of the claims, rather than the description above, and is intended to include any modifications within the scope and meaning equivalent to the terms of the claims.

The invention claimed is:
1. An electric vehicle on which a power storage device configured to be rechargeable is mounted and that is configured such that said power storage device can be charged by an external power supply,
said electric vehicle being configured to be able to be coupled, during charging, to a connector portion for supplying said external power supply, and in addition, being configured to be able to receive an external heat medium having certain thermal energy from outside the vehicle,
said electric vehicle comprising:
a heat capacity element configured to be able to store thermal energy;
a heat storage mechanism for having the thermal energy stored in said heat capacity element during charging; and
an air-conditioning mechanism for air-conditioning a vehicle compartment space by using the thermal energy stored in said heat capacity element, in response to an air-conditioning request,
said power storage device being used as said heat capacity element,
said heat capacity element being used for both heating and cooling in response to the air-conditioning request,
said heat storage mechanism including
a charging current controller for controlling a charging current of said power storage device,
a heat medium path configured to cause heat exchange between said external heat medium and said power storage device, and
a fan for taking said external heat medium into said electric vehicle,
upon receipt of a heating request, said charging current controller controls the charging current to increase resistive heat generation in said power storage device, and
upon receipt of a cooling request, said charging current controller controls the charging current to reduce the magnitude of the current as much as possible, and in addition, said fan increases an amount of contact between said power storage device and said external heat medium.
2. The electric vehicle according to claim 1, wherein said external heat medium is supplied through said connector portion, along with said external power supply.
3. The electric vehicle according to claim 1, wherein air-conditioned air in a building outside the vehicle is supplied as said external heat medium.
4. The electric vehicle according to claim 1, further comprising
a vehicle compartment air path configured to communicate with said vehicle compartment space and configured to take in air in said vehicle compartment space to cause heat exchange between the air and said power storage device, wherein
said air-conditioning mechanism includes a backflow mechanism for forming a flow of air in said vehicle compartment air path in a direction opposite to a direction in which the air is taken in from said vehicle compartment space such that the air after the heat exchange between the air and said power storage device is blown out toward said vehicle compartment space.
5. The electric vehicle according to claim 1, further comprising:
an electric power converting portion capable of generating a charging current for charging said power storage device from said external power supply;
a radiator portion for cooling said electric power converting portion through a first coolant;
a circulating mechanism for circulating said first coolant in a circulating path including said electric power converting portion and said radiator portion; and
a storage portion, disposed at said circulating path, configured to be able to store said first coolant, wherein
said heat capacity element includes said first coolant,
said electric power converting portion is configured to include a switching element, and
said heat storage mechanism further includes a controller adapted to the electric power converting portion for controlling said electric power converting portion during charging such that a cooling ability in said radiator portion is suppressed, and in addition, prescribed thermal energy is provided to said first coolant by a heat loss produced at said electric power converting portion due to a switching operation.

6. The electric vehicle according to claim 5, further comprising
a rotating electric machine having a coil of a phase connected in a star shape, wherein
said electric power converting portion is configured to receive said external power supply through a neutral point of said rotating electric machine,
said circulating path is formed to further include said rotating electric machine, and
said controller adapted to the electric power converting portion further controls said electric power converting portion such that prescribed thermal energy is provided to said first coolant by resistive heat generation that occurs in said coil of the phase of said rotating electric machine.

7. The electric vehicle according to claim 5, wherein
said air-conditioning mechanism further includes
a blowing out mechanism for blowing out air-conditioned air to said vehicle compartment space,
a first coolant introduction path through which said first coolant is guided to said blowing out mechanism, and
a first heat exchange portion for causing heat exchange between air and said first coolant guided through said first coolant introduction path to generate said air-conditioned air.

8. The electric vehicle according to claim 1, wherein
said heat capacity element includes a refrigerant contained in a refrigerant container, and
said heat storage mechanism further includes a refrigeration cycle mechanism for having thermal energy stored in said refrigerant by receiving said external power supply and by performing a refrigeration cycle during charging.

9. The electric vehicle according to claim 8, wherein
said air-conditioning mechanism further includes
a blowing out mechanism for blowing out air-conditioned air to said vehicle compartment space,
a second coolant introduction path that is formed to cause heat exchange between a second coolant and said refrigerant and through which said second coolant after the heat exchange is guided to said blowing out mechanism, and
a second heat exchange portion for causing heat exchange between air and said second coolant guided through said second coolant introduction path to generate said air-conditioned air.

10. A vehicle charging system, comprising:
an electric vehicle on which a power storage device configured to be rechargeable is mounted; and
a vehicle charging apparatus for charging said power storage device mounted on said electric vehicle by an external power supply,
said vehicle charging apparatus including a connector portion coupled to said electric vehicle during charging for supplying said external power supply to said electric vehicle,
said vehicle charging apparatus being configured to supply an external heat medium having certain thermal energy from outside the vehicle during charging,
said electric vehicle including
a heat capacity element configured to be able to store thermal energy,
a heat storage mechanism for having the thermal energy stored in said heat capacity element during charging, and
an air-conditioning mechanism for air-conditioning a vehicle compartment space by using the thermal energy stored in said heat capacity element, in response to an air-conditioning request,
said power storage device being used as said heat capacity element,
said heat capacity element being used for both heating and cooling in response to the air-conditioning request,
said heat storage mechanism including
a charging current controller for controlling a charging current of said power storage device,
a heat medium path configured to cause heat exchange between said external heat medium and said power storage device, and
a fan for taking said external heat medium into said electric vehicle,
upon receipt of a heating request, said charging current controller controls the charging current to increase resistive heat generation in said power storage device, and
upon receipt of a cooling request, said charging current controller controls the charging current to reduce the magnitude of the current as much as possible, and in addition, said fan increases an amount of contact between said power storage device and said external heat medium.

11. The vehicle charging system according to claim 10, wherein
said vehicle charging apparatus supplies air-conditioned air in a building outside the vehicle to said electric vehicle as said external heat medium.

12. The vehicle charging system according to claim 10, wherein
said electric vehicle further includes a vehicle compartment air path configured to communicate with said vehicle compartment space and configured to take in air in said vehicle compartment space to cause heat exchange between the air and said power storage device, and
said air-conditioning mechanism includes a backflow mechanism for forming a flow of air in said vehicle compartment air path in a direction opposite to a direction in which the air is taken in from said vehicle compartment space such that the air after the heat exchange between the air and said power storage device is blown out toward said vehicle compartment space.

* * * * *

UNITED STATES PATENT AND TRADEMARK OFFICE
CERTIFICATE OF CORRECTION

PATENT NO.         : 8,037,954 B2
APPLICATION NO.    : 12/443754
DATED              : October 18, 2011
INVENTOR(S)        : Tomonari Taguchi It is certified that error appears in the above-identified patent and that said Letters Patent is hereby corrected as shown below:

| Column | Line | |
|--------|------|---|
| 12 | 18 | Change "5As" to --As--. |
| 14 | 19 | Change "CONY" to --CONV--. |
| 17 | 65 | Change "current Iin/cos" to --current Iin/cos$\theta$--. |

Signed and Sealed this
Fifth Day of June, 2012

David J. Kappos
*Director of the United States Patent and Trademark Office*